United States Patent
Yi et al.

(10) Patent No.: US 12,415,826 B2
(45) Date of Patent: Sep. 16, 2025

(54) ORGANOMETALLIC COMPOUND, ORGANIC LIGHT-EMITTING DEVICE INCLUDING THE SAME, AND DIAGNOSTIC COMPOSITION FOR INCLUDING THE ORGANOMETALLIC COMPOUND

(71) Applicant: Samsung Electronics Co., Ltd., Suwon-si (KR)

(72) Inventors: Jeoungin Yi, Seoul (KR); Seungyeon Kwak, Suwon-si (KR); Yoonhyun Kwak, Seoul (KR); Sangdong Kim, Seongnam-si (KR); Sunyoung Lee, Seoul (KR); Aram Jeon, Seoul (KR); Hyeonho Choi, Seoul (KR); Kyuyoung Hwang, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 734 days.

(21) Appl. No.: 17/060,731

(22) Filed: Oct. 1, 2020

(65) Prior Publication Data

US 2021/0175444 A1    Jun. 10, 2021

(30) Foreign Application Priority Data

Dec. 10, 2019   (KR) .......................... 10-2019-0163877

(51) Int. Cl.
   *C07F 15/00*      (2006.01)
   *H10K 50/15*      (2023.01)
   (Continued)

(52) U.S. Cl.
   CPC ......... *C07F 15/0086* (2013.01); *H10K 85/00* (2023.02); *H10K 85/322* (2023.02);
   (Continued)

(58) Field of Classification Search
   CPC ............... H10K 85/346; H10K 85/322; H10K 85/324; H10K 85/326; H10K 85/344;
   (Continued)

(56) References Cited

U.S. PATENT DOCUMENTS 6,358,634 B1 * 3/2002 Igarashi ............... H10K 85/321
                                                       428/917
10,147,893 B2   12/2018 Lee et al.
(Continued)

FOREIGN PATENT DOCUMENTS

CN    106939024 A    7/2017
KR    20150082101 A  7/2015
(Continued)

OTHER PUBLICATIONS

Zhang, Jie, et al. "New phosphorescent platinum (II) Schiff base complexes for PHOLED applications." Journal of Materials Chemistry 22.32 (2012): 16448-16457. (Year: 2012).*

(Continued)

*Primary Examiner* — Jennifer A Boyd
*Assistant Examiner* — Braelyn R Watson
(74) *Attorney, Agent, or Firm* — CANTOR COLBURN LLP

(57) ABSTRACT

Provided are an organometallic compound of Formula 1, an organic light-emitting device including the organometallic
(Continued)

compound, and a diagnostic composition including the organometallic compound.

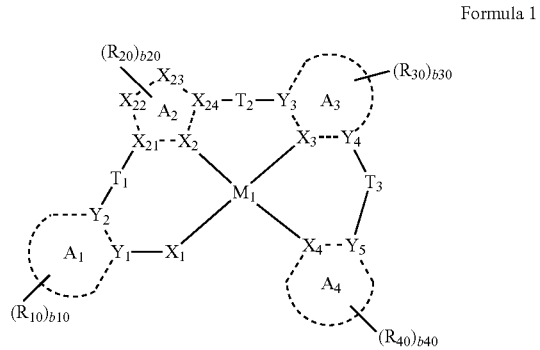

Formula 1

In Formula 1, ring $A_1$, ring $A_3$, and ring $A_4$ are each independently a $C_5$-$C_{30}$ carbocyclic group or a $C_2$-$C_{60}$ heterocyclic group, and ring $A_2$ is an N-containing 5-membered heterocyclic group.

17 Claims, 1 Drawing Sheet

(51) Int. Cl.
| | |
|---|---|
| *H10K 50/16* | (2023.01) |
| *H10K 50/17* | (2023.01) |
| *H10K 50/18* | (2023.01) |
| *H10K 85/00* | (2023.01) |
| *H10K 85/30* | (2023.01) |
| *H10K 85/60* | (2023.01) |

(52) U.S. Cl.
CPC ......... *H10K 85/324* (2023.02); *H10K 85/326* (2023.02); *H10K 85/344* (2023.02); *H10K 85/346* (2023.02); *H10K 85/371* (2023.02); *H10K 85/381* (2023.02); *H10K 85/6572* (2023.02); *H10K 85/6574* (2023.02); *H10K 85/6576* (2023.02); *H10K 50/15* (2023.02); *H10K 50/16* (2023.02); *H10K 50/171* (2023.02); *H10K 50/18* (2023.02)

(58) Field of Classification Search
CPC ............ H10K 85/371; H10K 85/381; H10K 85/6572; H10K 85/6574; H10K 85/6576; H10K 50/15; H10K 50/16; H10K 50/171; H10K 50/18; H10K 50/11; H10K 2101/10; H10K 50/12; H10K 50/14; H10K 85/331; H10K 85/341; C07F 15/0086; C07F 1/08; C07F 1/10; C07F 1/12; C07F 3/006; C07F 3/02; C07F 3/04; C07F 3/06; C07F 5/00; C07F 5/06; C07F 7/00; C07F 7/28; C07F 7/30; C07F 13/00; C07F 15/06; C07F 15/0046; C07F 15/0073; C07F 15/006; C09K 11/06; C09K 2211/182–188

See application file for complete search history.

(56) References Cited

U.S. PATENT DOCUMENTS

| | | | | |
|---|---|---|---|---|
| 2005/0123792 | A1* | 6/2005 | Deaton | H05B 33/14 313/506 |
| 2007/0103060 | A1* | 5/2007 | Itoh | H10K 85/346 313/504 |
| 2009/0236974 | A1* | 9/2009 | Tamaru | H10K 50/11 313/504 |
| 2013/0274473 | A1 | 10/2013 | Che et al. | |
| 2015/0021585 | A1* | 1/2015 | Yu | C09K 11/06 257/40 |
| 2015/0194615 | A1* | 7/2015 | Lin | C07F 15/0093 546/4 |
| 2017/0237023 | A1 | 8/2017 | Kim et al. | |
| 2021/0210701 | A1 | 7/2021 | Lin et al. | |

FOREIGN PATENT DOCUMENTS

| | | |
|---|---|---|
| KR | 1020160121369 A | 10/2016 |
| KR | 1020170094652 A | 8/2017 |

OTHER PUBLICATIONS

Turner, Eric, Nathan Bakken, and Jian Li. "Cyclometalated platinum complexes with luminescent quantum yields approaching 100%." Inorganic chemistry 52.13 (2013): 7344-7351. (Year: 2013).*
Baranoff, Etienne, et al. "Cyclometalated iridium (III) complexes based on phenyl-imidazole ligand." Inorganic chemistry 50.2 (2011): 451-462. (Year: 2011).*
English Abstract of CN 106939024.
Shiu-Lun Lai, et al., High Efficiency White Organic Light-Emitting Devices Incorporating Yellow Phosphorescent Platinum(II) Complex and Composite Blue Host, Advanced Functional Materials (2013), 23(41), 5168-5176.
English Translation of Office Action dated Jul. 22, 2024, issued in corresponding KR Patent Application No. 10-2019-0163877, 8 pp.
Office Action dated Jul. 22, 2024, issued in corresponding KR Patent Application No. 10-2019-0163877, 9 pp.

* cited by examiner

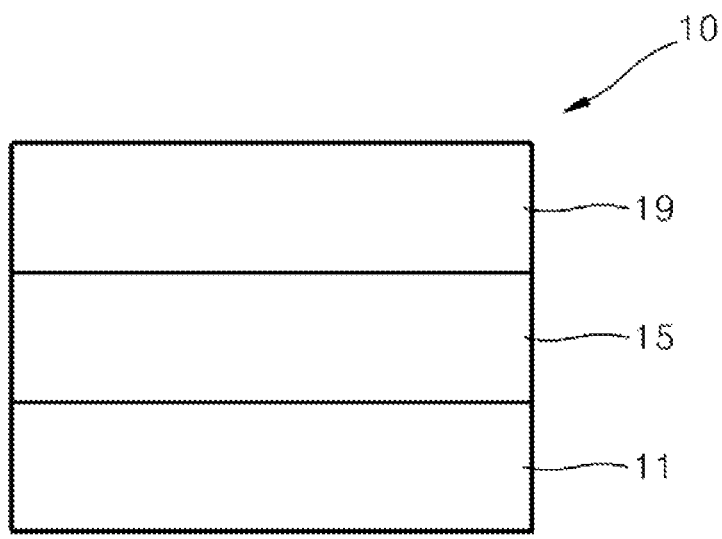

ORGANOMETALLIC COMPOUND, ORGANIC LIGHT-EMITTING DEVICE INCLUDING THE SAME, AND DIAGNOSTIC COMPOSITION FOR INCLUDING THE ORGANOMETALLIC COMPOUND

CROSS-REFERENCE TO RELATED APPLICATION

This application claims priority to and the benefit of Korean Patent Application No. 10-2019-0163877, filed on Dec. 10, 2019, in the Korean Intellectual Property Office, the content of which is incorporated herein in its entirety by reference.

BACKGROUND

1. Field

One or more embodiments relate to organometallic compounds, organic light-emitting devices including the same, and diagnostic compositions including the organometallic compounds.

2. Description of Related Art

Organic light-emitting devices are self-emission devices, which have improved characteristics in terms of viewing angles, response time, brightness, driving voltages, and response speed, and produce full-color images.

In an example, an organic light-emitting device includes an anode, a cathode, and an organic layer between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Meanwhile, luminescent compounds, for example, phosphorescent compounds, may be used for monitoring, sensing, and detecting biological materials such as various cells and proteins.

SUMMARY

One or more embodiments relate to organometallic compounds, organic light-emitting devices including the same, and diagnostic compositions including the organometallic compounds.

Additional aspects will be set forth in part in the description which follows and, in part, will be apparent from the description, or may be learned by practice of the presented embodiments of the disclosure.

According to an aspect of an embodiment, an organometallic compound represented by Formula 1 is provided.

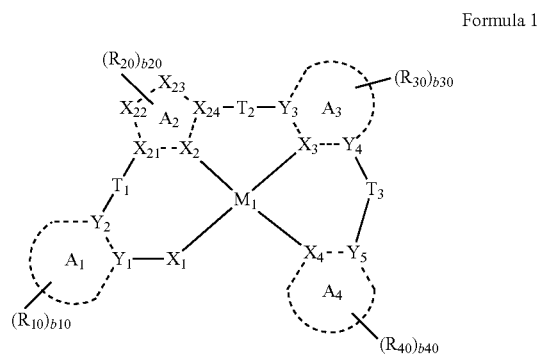

Formula 1

In Formula 1,
ring $A_1$, ring $A_3$, and ring $A_4$ may each independently be a $C_5$-$C_{30}$ carbocyclic group or a $C_2$-$C_{60}$ heterocyclic group,
ring $A_2$ is an N-containing 5-membered heterocyclic group,
$X_1$ may be N, O, or S,
$X_2$ may be N or C, $X_{21}$, $X_{22}$, $X_{23}$, and $X_{24}$ may each independently be N, N(R), C(R), C(R)(R'), O, or S, wherein at least one of $X_2$ and $X_{21}$ to $X_{24}$ may be N or N(R),
$X_3$ and $X_4$ may each independently be N or C, and at least one of $X_3$ and $X_4$ may be C,
a bond between $X_1$ and $M_1$, a bond between $X_1$ and $M_1$, a bond between $X_3$ and $M_1$, and a bond between $X_4$ and $M_1$ may each independently be a covalent bond or a coordination bond,
$Y_1$ to $Y_5$ may each independently N or C,
$T_1$ to $T_3$ may each independently be a single bond, *—N[(L$_1$)$_{a1}$-(R$_1$)$_{b1}$]—*', *—B(R$_1$)—*', *—P(R$_1$)—*', *—C(R$_1$)(R$_2$)—*', *—Si(R$_1$)(R$_2$)—*', *—Ge(R$_1$)(R$_2$)—*', *—S—*', *—Se—*', *—O—*', *—C(=O)—*', *—S(=O)—*', *—S(=O)$_2$—*', *—C(R$_1$)=*', *=C(R$_1$)—*', *—C(R$_1$)=C(R$_2$)—*', *—C(=S)—*', or *—C≡C—*',
$L_1$ may be a single bond, a substituted or unsubstituted $C_5$-$C_{30}$ carbocyclic group, or a substituted or unsubstituted $C_1$-$C_{30}$ heterocyclic group,
a1 may be an integer from 1 to 3, wherein when a5 is 2 or more, two or more $L_1$(s) may be identical to or different from each other,
b1 may be an integer from 1 to 5, wherein when b1 is 2 or more, two or more $R_1$(s) may be identical to or different from each other,
$R_1$ and $R_2$ may optionally be linked to each other via a single bond, a double bond, or a first linking group to form a substituted or unsubstituted $C_5$-$C_{30}$ carbocyclic group or a substituted or unsubstituted $C_1$-$C_{30}$ heterocyclic group,
R, R', $R_1$, $R_2$, $R_{10}$, $R_{20}$, $R_{30}$, and $R_{40}$ may each independently be hydrogen, deuterium, —F, —Cl, —Br, —I, —SF$_5$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $-N(Q_1)(Q_2)$, $-Si(Q_3)(Q_4)(Q_5)$, $-B(Q_6)(Q)$, or $-P(=O)(Q_8)(Q_9)$, b10, b20, b30, and b40 may each independently be an integer from 1 to 10, when b20 is 2 or more, two or more $R_{20}$(s) may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is the same as explained in connection with $R_{10}$, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, $-F$, $-Cl$, $-Br$, $-I$, $-CD_3$, $-CD_2H$, $-CDH_2$, $-CF_3$, $-CF_2H$, $-CFH_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group, a $C_1$-$C_{60}$ alkyl group, a $C_2$-$C_{60}$ alkenyl group, a $C_2$-$C_{60}$ alkynyl group, or a $C_1$-$C_{10}$ alkoxy group, each substituted with at least one of deuterium, $-F$, $-Cl$, $-Br$, $-I$, $-CD_3$, $-CD_2H$, $-CDH_2$, $-CF_3$, $-CF_2H$, $-CFH_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $-N(Q_{11})(Q_{12})$, $-Si(Q_{13})(Q_{14})(Q_{15})$, $-B(Q_{16})(Q_{17})$, $-P(=O)(Q_{18})(Q_{19})$, or any combination thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with at least one of deuterium, $-F$, $-Cl$, $-Br$, $-I$, $-CD_3$, $-CD_2H$, $-CDH_2$, $-CF_3$, $-CF_2H$, $-CFH_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryl group substituted with at least one of a $C_1$-$C_{60}$ alkyl group, a $C_6$-$C_{60}$ aryl group, or any combination thereof, a $C_6$-$C_0$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

$-N(Q_{21})(Q_{22})$, $-Si(Q_{23})(Q_{24})(Q_{25})$, $-B(Q_{26})(Q_{27})$, $-P(=O)(Q_{28})(Q_{29})$, or a combination thereof, or $-N(Q_{31})(Q_{32})$, $-Si(Q_{33})(Q_{34})(Q_{35})$, $-B(Q_{36})(Q_{37})$, or $-P(=O)(Q_{38})(Q_{39})$, wherein $Q_1$ to $Q_9$, $Q_{11}$ to $Q_{19}$, $Q_{21}$ to $Q_{29}$ and $Q_{31}$ to $Q_{39}$ may each independently be hydrogen, deuterium, $-F$, $-Cl$, $-Br$, $-I$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, Another aspect provides an organic light-emitting device including a first electrode, a second electrode, and an organic layer including an emission layer between the first electrode and the second electrode, wherein the organic layer includes at least one of the organometallic compounds.

Another aspect provides a diagnostic composition including at least one organometallic compound represented by Formula 1.

BRIEF DESCRIPTION OF THE DRAWING

The above and other aspects, features, and advantages of certain embodiments of the disclosure will be more apparent from the following description taken in conjunction with FIGURE which shows a schematic cross-sectional view of an organic light-emitting device according to an exemplary embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein.

Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the FIGURE Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within 30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

An aspect of the present disclosure provides an organometallic compound represented by Formula 1 below:

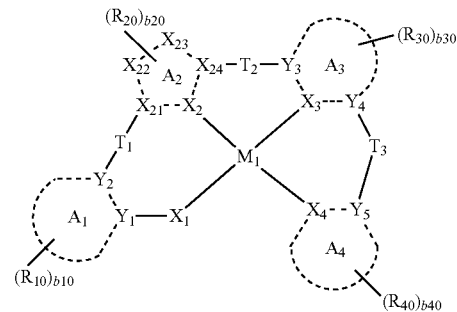

Formula 1

$M_1$ in Formula 1 may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au).

In one or more embodiments, $M_1$ may be Pd, Pt, or Au, but embodiments of the present disclosure are not limited thereto.

Ring $A_1$, ring $A_3$, and ring $A_4$ in Formula 1 may each independently be a $C_5$-$C_{30}$ carbocyclic group or a $C_2$-$C_{60}$ heterocyclic group.

In one or more embodiments, ring $A_1$, ring $A_3$, and ring $A_4$ may each independently be a benzene group, a naphthalene group, an anthracene group, a phenanthrene group, a triphenylene group, a pyrene group, a chrysene group, cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, a tetrazole group, an oxazole group, an isooxazole group, a thiazole group, an isothiazole group, an oxadiazole group, a thiadiazole group, a benzopyrazole group, a benzimidazole group, an indazole group, a benzoxazole group, a benzothiazole group, a benzoxadiazole group, a benzothiadiazole group, a benzotriazole group, a diazaindene group, a triazaindene group, a 5,6,7,8-tetrahydroisoquinoline group, or a 5,6,7,8-tetrahydroquinoline group.

For example, ring $A_1$ ring $A_3$, and ring $A_4$ may each independently be a benzene group, a naphthalene group, a 1,2,3,4-tetrahydronaphthalene group, a fluorene group, a carbazole group, a dibenzofuran group, a dibenzothiophene group, or a dibenzosilole group.

Ring $A_2$ in Formula 1 may be an N-containing 5-membered heterocyclic group.

In one or more embodiments, ring $A_2$ may be a pyrrole group, a pyrazole group, an imidazole group, a triazole group, a tetrazole group, an oxazole group, an isooxazole group, a thiazole group, an isothiazole group, an oxadiazole group, or a thiadiazole group.

In one or more embodiments, ring $A_2$ may be a pyrazole group, an imidazole group, a triazole group, or a tetrazole group.

In one or more embodiments, ring $A_2$ may optionally be condensed with a ring that is formed by linking two or more $R_{20}(s)$ together.

$X_1$ in Formula 1 may be N, O, or S.

In one or more embodiments, in Formula 1, $X_1$ may be O or S, and a bond between $X_1$ and $M_1$ may be a covalent bond.

For example, $X_1$ may be O, but embodiments of the present disclosure are not limited thereto.

In Formula 1, $X_2$ may be N or C, and $X_{21}$, $X_{22}$, $X_{23}$, and $X_{24}$ may each independently be N, N(R), C(R), C(R)(R'), O, or S, wherein at least one of $X_2$ and $X_{21}$ to $X_{24}$ may be N or N(R).

In one or more embodiments, $X_2$ may be N, and a bond between $X_2$ and $M_1$ may be a coordination bond.

In one or more embodiments, $X_{21}$ to $X_{24}$ may each be C(R) or C(R)(R').

In one or more embodiments, at least one of $X_{21}$ to $X_{24}$ may be N or N(R).

$X_3$ and $X_4$ in Formula 1 may each independently be N or C, and at least one of $X_3$ and $X_4$ may be C.

For example, $X_3$ may be C and $X_4$ may be N; or $X_3$ may be N and $X_4$ may be C.

In one or more embodiments, in Formula 1, $X_3$ may be C and $X_4$ may be N.

In Formula 1, one of a bond between $X_3$ and $M_1$ and a bond between $X_4$ and $M_1$ may be a covalent bond, and the other bond may be coordination bond. Thus, the organometallic compound represented by Formula 1 may be electrically neutral.

In one or more embodiments, a bond between $X_3$ and $M_1$ may be a covalent bond, and a bond between $X_4$ and $M_1$ may be a coordination bond, but embodiments of the present disclosure are not limited thereto.

In Formula 1, $X_{21}$ may be N or $C(R_{2a})$, $X_{22}$ may be N or $C(R_{2b})$, $X_{23}$ may be N or $C(R_{2c})$, and at least one of $X_{21}$ to $X_{23}$ may be N.

For example, one or two of $X_{21}$ to $X_{23}$ may be N.

In one or more embodiments, in Formula 1, $X_{21}$ may be N, $X_{22}$ may be $C(R_{2b})$, and $X_{23}$ may be $C(R_{2c})$; or $X_{21}$ may be N, $X_{22}$ may be $C(R_{2b})$, and $X_{23}$ may be N, but embodiments of the present disclosure are not limited thereto.

In one or more embodiments, $R_{2a}$, $R_{2b}$, and $R_{2c}$ may each independently be the same as described in connection with R, R', and $R_{20}$.

In one or more embodiments, a moiety represented by

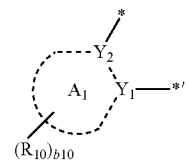

in Formula 1 may be a group represented by one of Formulae CY1-1 to CY1-16:

CY1-1

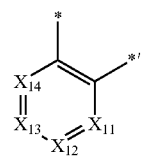

CY1-2

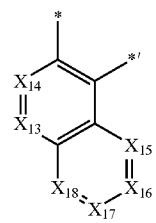

CY1-3

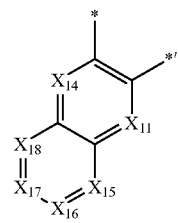

CY1-4

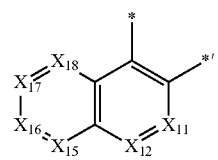

-continued
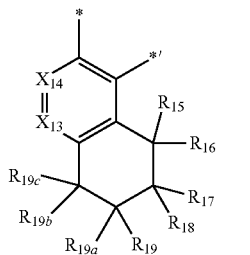
CY1-5
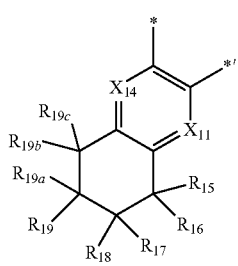
CY1-6
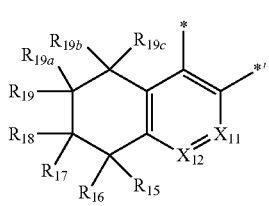
CY1-7
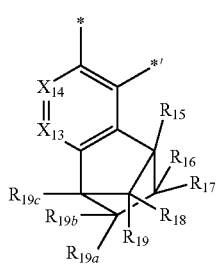
CY1-8
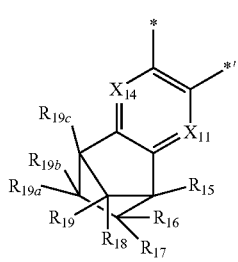
CY1-9
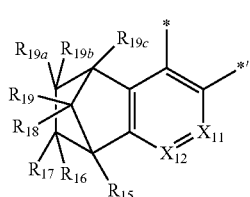
CY1-10
-continued
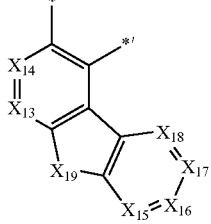
CY1-11
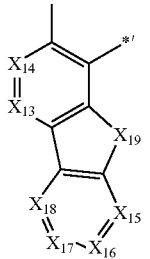
CY1-12
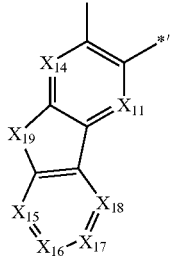
CY1-13
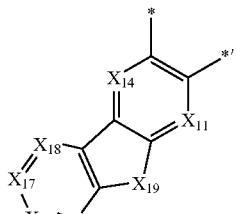
CY1-14
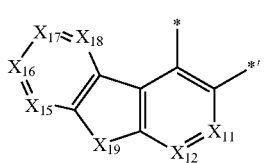
CY1-15
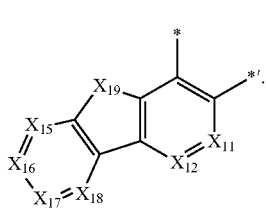
CY1-16
In Formulae CY1-1 to CY1-16,
$X_{11}$ may be N or $C(R_{11})$, $X_{12}$ may be N or $C(R_{12})$, $X_{13}$ may be N or $C(R_{13})$, $X_{14}$ may be N or $C(R_{14})$, $X_{15}$ may be N or $C(R_{15})$, $X_{16}$ may be N or $C(R_{16})$, $X_{17}$ may be N or $C(R_{17})$, and $X_{18}$ may be N or $C(R_{18})$,
$X_{19}$ may be $C(R_{19a})(R_{19b})$, $N(R_{19})$, O, S, or $Si(R_{19a})(R_{19b})$,
$R_{11}$ to $R_{19}$, $R_{19a}$, and $R_{19b}$ are each independently the same as described in connection with $R_{10}$,

* and *' each indicate a binding site to a neighboring atom.

In one or more embodiments, a moiety represented by

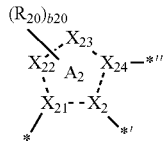

in Formula 1 may be a group represented by one of Formulae CY2-1 to CY2-10:

CY2-1
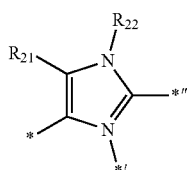

CY2-2
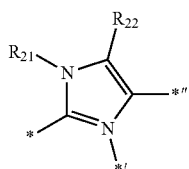

CY2-3
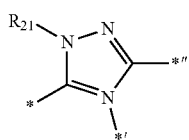

CY2-4
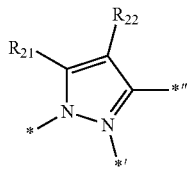

CY2-5
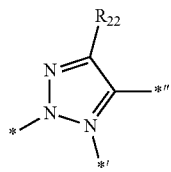

CY2-6
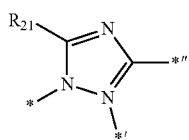

CY2-7
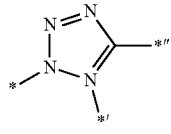

-continued

CY2-8
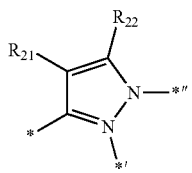

CY2-9
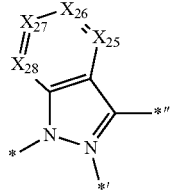

CY2-10
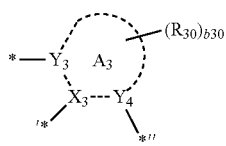

In Formulae CY2-1 to CY2-10, $X_{25}$ may be N or $C(R_{23})$, $X_{26}$ may be N or $C(R_{24})$, $X_{27}$ may be N or $C(R_{25})$, and $X_{28}$ may be N or $C(R_{26})$, $R_{21}$ to $R_{26}$ are each independently the same as described in connection with $R_{20}$, and

*, *' and *" may each independently be a binding site to a neighboring atom.

In one or more embodiments, a moiety represented by

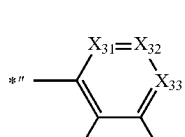

in Formula 1 may be a group represented by one of Formulae CY3-1 to CY3-22:

CY3-1
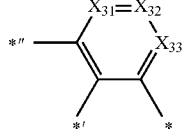

CY3-2
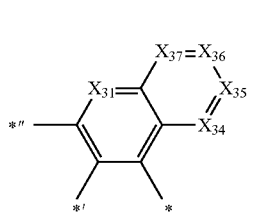

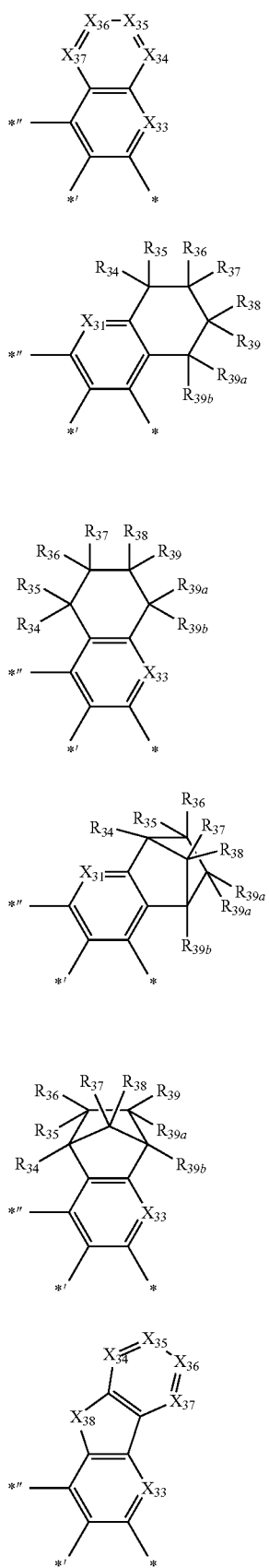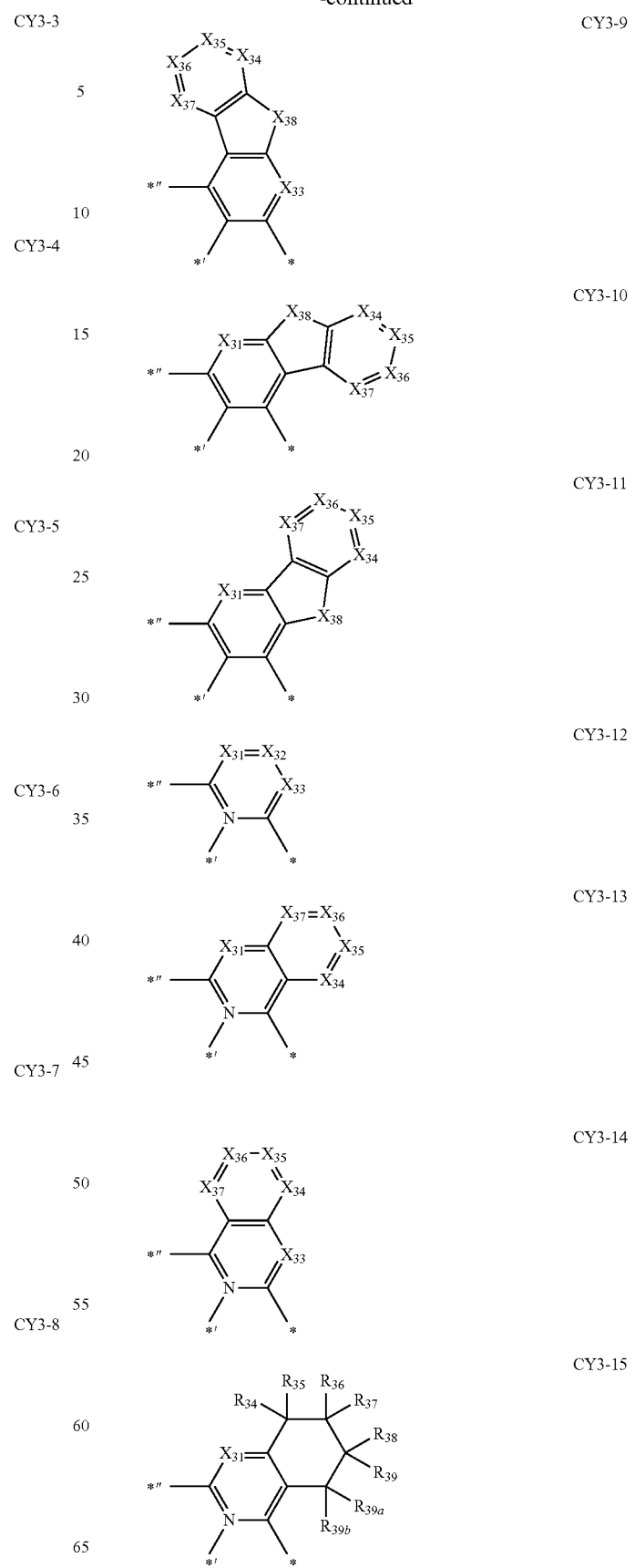

-continued

CY3-16 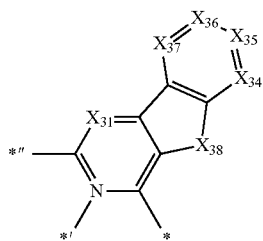

CY3-17

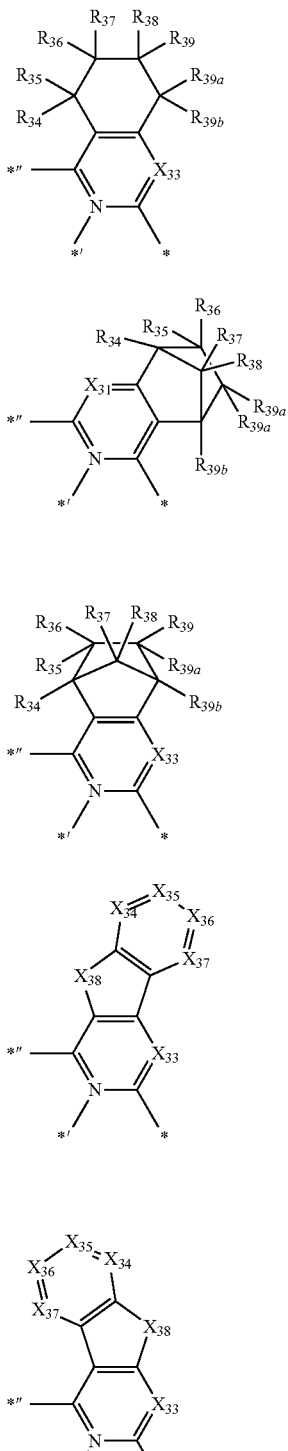

CY3-18

CY3-19

CY3-20

CY3-21

In Formulae CY3-1 to CY3-22, $X_{31}$ may be N or $C(R_{31})$, $X_{32}$ may be N or $C(R_{32})$, $X_{33}$ may be N or $C(R_{33})$, $X_{34}$ may be N or $C(R_{34})$, $X_{35}$ may be N or $C(R_{35})$, $X_{36}$ may be N or $C(R_{36})$, and $X_{37}$ may be N or $C(R_{37})$, $X_{39}$ may be $C(R_{39a})(R_{39b})$, $N(R_{39})$, O, S, or $Si(R_{39a})(R_{39b})$, $R_{31}$ to $R_{39}$, $R_{39a}$, and $R_{39b}$ are each independently the same as described in connection with $R_{30}$, and

*, *' and *'' may each independently be a binding site to a neighboring atom.

In one or more embodiments, a moiety represented by

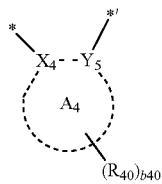

in Formula 1 may be a group represented by one of Formulae CY4-1 to CY4-8:

CY4-1

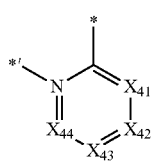

CY4-2

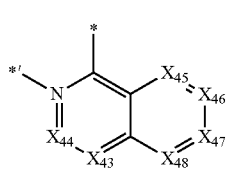

CY4-3

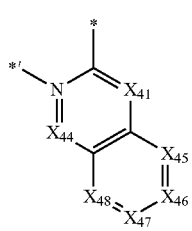

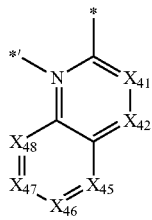
CY4-4

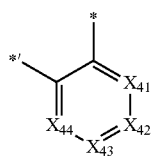
CY4-5

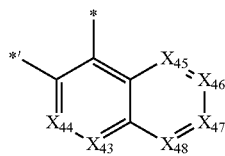
CY4-6

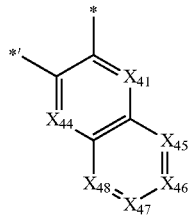
CY4-7

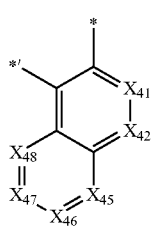
CY4-8

In Formulae CY4-1 to CY4-8, $X_{41}$ may be N or $C(R_{41})$, $X_{42}$ may be N or $C(R_{42})$, $X_{43}$ may be N or $C(R_{43})$, $X_{44}$ may be N or $C(R_{44})$, $X_{45}$ may be N or $C(R_{45})$, $X_{46}$ may be N or $C(R_{46})$, $X_{47}$ may be N or $C(R_{47})$, and $X_{48}$ may be N or $C(R_{48})$, $R_{41}$ to $R_{48}$ are each independently the same as described in connection with $R_{40}$, and

* and *' each indicate a binding site to a neighboring atom.

$T_1$ to $T_3$ in Formula 1 may each independently be a single bond, *—$N[(L_1)_{a1}$-$(R_1)_{b1}]$—*' *—$B(R_1)$—*, *—$P(R_1)$—*, *—$C(R_1)(R_2)$—*', *—$Si(R_1)(R_2)$—*', *—$Ge(R_1)(R_2)$—*', *—S—*', *—Se—*', *—O—*' *—(=O)—*', *—S(=O)—*', *—$S(=O)_2$—*', *—$C(R_1)$=*', *=$C(R_1)$—*', *—$C(R_1)$=$C(R_2)$—*', *—C(=S)—*', or *—C≡C—*'. $R_1$ and $R_2$ may be understood by referring to the related description to be presented later.

In one or more embodiments, $T_1$ and $T_2$ may each be a single bond.

In one or more embodiments, $T_3$ may be *—$N[(L_1)_{a1}$-$(R_1)_{b1}]$—*', *—$C(R_1)(R_2)$—*', *—$Si(R_1)(R_2)$—*', *—O—*', or *—S—*'.

$L_1$ in Formula 1 may be a single bond, a substituted or unsubstituted $C_5$-$C_{30}$ carbocyclic group, or a substituted or unsubstituted $C_1$-$C_{30}$ heterocyclic group.

a1 may be 1 to 3, wherein when a1 is 2 or more, two or more $L_1$(s) may be identical to or different from each other. For example, a1 may be 1 or 2.

b1 may be 1 to 5, wherein when b1 is 2 or more, two or more of $R_1$(s) may be identical to or different from each other. For example, b1 may be 1, 2, or 3.

In one or more embodiments, $L_1$ may be: a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with at least one deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{60}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

$R_1$ and $R_2$ may optionally be linked together, via a single bond, a double bond, or a first linking group, to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$ (for example, a fluorene group, a xanthene group, or an acridine group, each unsubstituted or substituted with at least one $R_{10a}$). $R_{10a}$ is the same as described in connection with $R_1$.

The first linking group may be *—$N(R_3)$—*', *—$B(R_3)$—*', *—$P(R_3)$—*', *—$C(R_3)(R_4)$—*', *—$Si(R_3)(R_4)$—*', *—$Ge(R_3)(R_4)$—*', *—S—*', *—Se—*', *—O—*', *—C(=O)—*', *—S(=O)—*', *—$S(=O)_2$—*', *—$C(R_3)$=*', *=$C(R_3)$=$C(R_4)$—*', *—C(=S)—*', or *—C≡C—*', $R_3$ and $R_4$ are the same as described in connection with $R_1$, and * and *' may each be a binding site to a neighboring atom.

R, R', $R_1$, $R_2$, $R_{10}$, $R_{20}$, $R_{30}$, and $R_{40}$ in Formula 1 may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), or —P(=O)($Q_8$)($Q_9$).

b10, b20, b30 and b40 in Formula 1 may each independently be an integer from 1 to 10, and when b20 is 2 or more, two or more $R_{20}$(s) may optionally be linked together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$. $R_{10a}$ is the same as described in connection with $R_{10}$.

In one or more embodiments, R, R', $R_1$, $R_2$, $R_{10}$, $R_{20}$, $R_{30}$, and $R_{40}$ may each independently be: hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, —SF$_5$, $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with at least one deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or any combination thereof; or —N($Q_1$)($Q_2$), —Si($Q_3$)($Q_4$)($Q_5$), —B($Q_6$)($Q_7$), or —P(=O)($Q_8$)($Q_9$), wherein $Q_1$ to $Q_9$ may each independently be:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CH$_3$, —CD$_2$CD$_3$, —CD$_2$CD$_2$H, or —CD$_2$CDH$_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each substituted with at least one deuterium, a $C_1$-$C_{10}$ alkyl group, a phenyl group, or any combination thereof.

For example, $R_1$ and $R_2$ may each independently be:

a $C_1$-$C_{30}$ alkyl group;

a $C_1$-$C_{30}$ alkyl group, substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group; or a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, or any combination thereof.

In one or more embodiments, $R_1$, $R_2$, $R_{10}$, $R_{20}$, $R_{30}$, and $R_{40}$ may each independently be:

hydrogen, deuterium, —F, a cyano group, a nitro group, —$SF_5$, a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a carbazolyl group, a dibenzofuranyl group, or a dibenzothiophenyl group;

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a carbazolyl group, a dibenzofuranyl group, or a dibenzothiophenyl group, each substituted with deuterium, —F, —$CD_3$, —$CD_2H$, —$CDH_2$, —$CF_3$, —$CF_2H$, —$CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a carbazolyl group, a dibenzofuranyl group, a dibenzothiophenyl group, or any combination thereof; or —N(Q$_1$)(Q$_2$), —Si(Q$_3$)(Q$_4$)(Q$_5$), —B(Q$_6$)(Q$_7$), or —P(=O)(Q$_8$)(Q$_9$), wherein Q$_1$ to Q$_9$ may each independently be:
—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CH$_3$, —CD$_2$CD$_3$, —CD$_2$CD$_2$H, or —CD$_2$CDH$_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each substituted with at least one deuterium, a C$_1$ to C$_{10}$ alkyl group, a phenyl group, or any combination thereof.

For example, R, R', R$_1$, R$_2$, R$_{10}$, R$_{20}$, R$_{30}$, and R$_{40}$ may each independently be hydrogen, deuterium, —F, a cyano group, a nitro group, —SF$_5$, —CH$_3$, —CD$_3$, —CD$_2$H, —CDH$_2$, —CF$_3$, —CF$_2$H, —CFH$_2$, a group represented by one of Formulas 9-1 to 9-19, a group represented by one of Formulae 10-1 to 10-46, or —Si(Q$_3$)(Q$_4$)(Q$_5$):

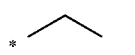
9-1

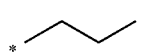
9-2

9-3

9-4

9-5

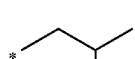
9-6

9-7

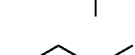
9-8

9-9

-continued

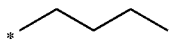
9-10

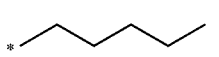
9-11

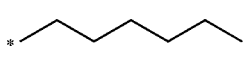
9-12

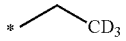
9-13

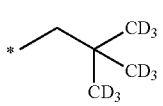
9-14

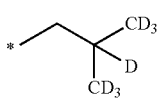
9-15

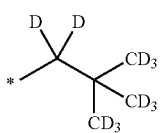
9-16

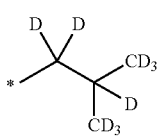
9-17

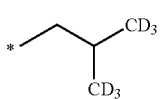
9-18

9-19

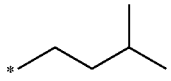
10-1

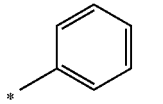
10-2

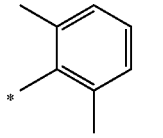
10-3

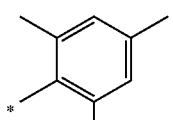
10-4

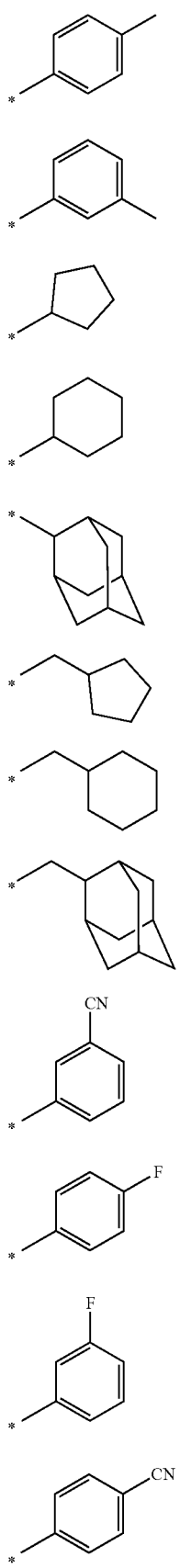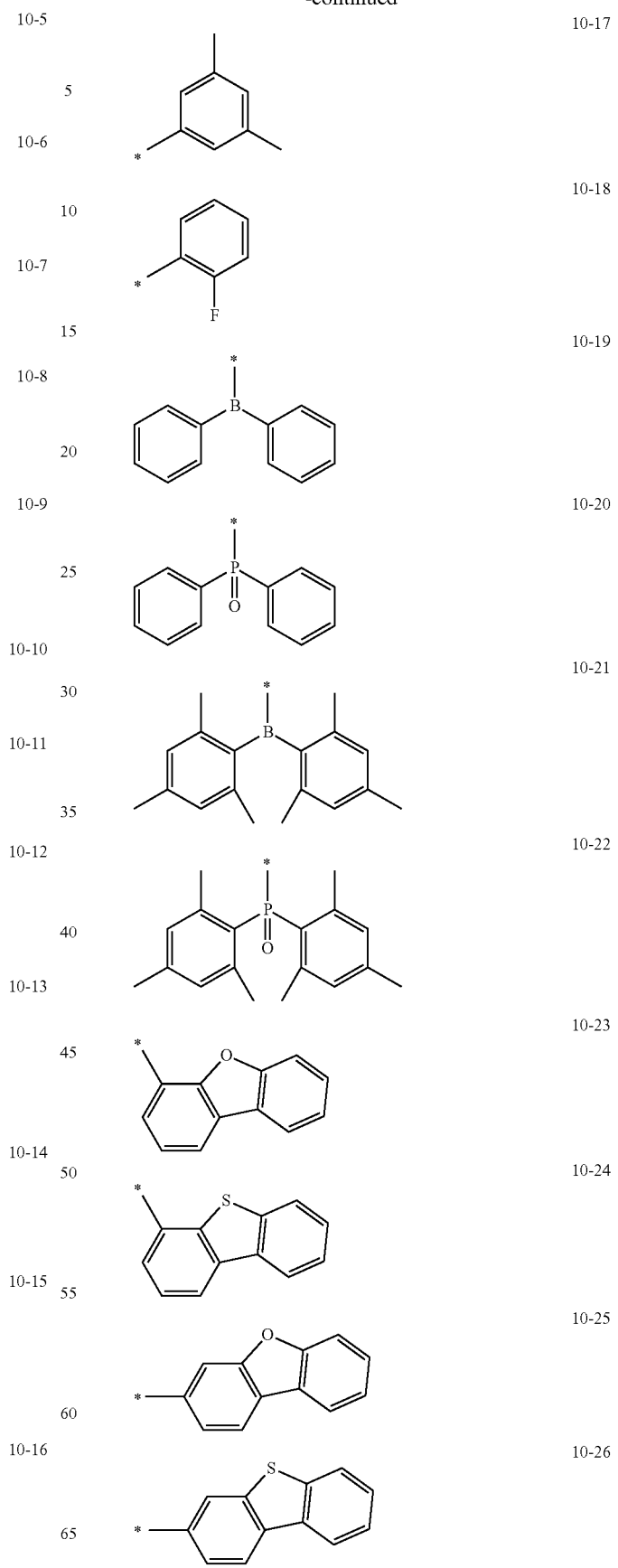

-continued
10-27 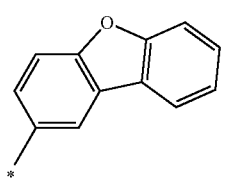
10-28 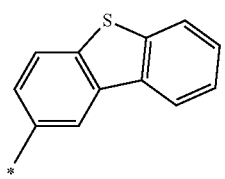
10-29 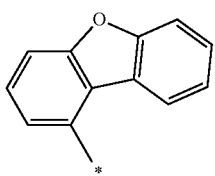
10-30 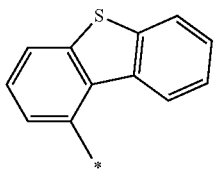
10-31 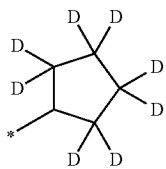
10-32 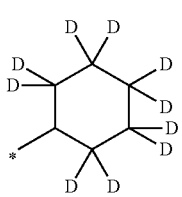
10-33 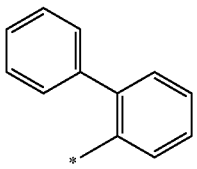
10-34 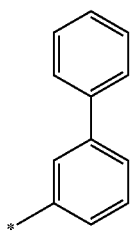
-continued
10-35 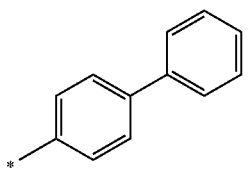
10-36 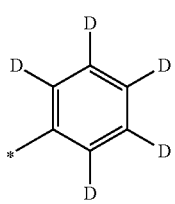
10-37 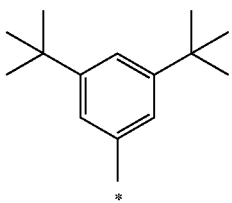
10-38 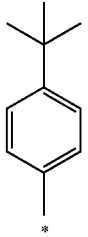
10-39 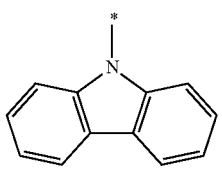
10-40 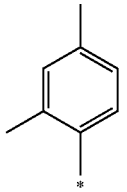
10-41 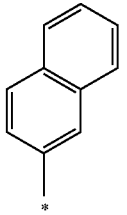

10-42

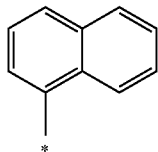

10-43

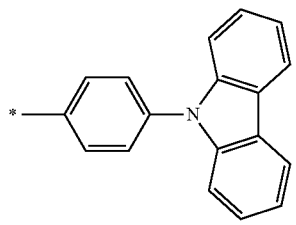

10-44

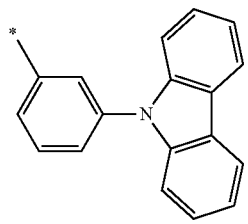

10-45

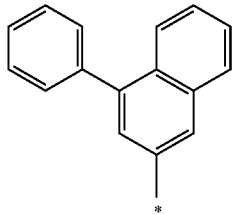

10-46

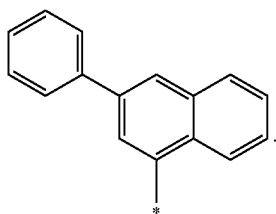

* in Formulae 9-1 to 9-19 and 10-1 to 10-46 indicates a binding site to a neighboring atom.

In one or more embodiments, at least one $R_{10}$ may be a group represented by one of Formulae 9-1 to 9-19.

In one or more embodiments, at least one $R_{20}$ may be a group represented by one of Formulae 10-1 to 10-46.

In one or more embodiments, in Formula 1,
ring $A_1$ and ring $A_3$ may each be a benzene group and ring $A_4$ may be a pyridine group,
$X_2$ and $X_4$ may each be N and $X_3$ may be C,
a bond between $X_2$ and $M_1$ and a bond between $X_4$ and $M_1$ may each be a coordination bond, and a bond between $X_3$ and $M_1$ may be a covalent bond,
$Y_1$ to $Y_5$ may each be C,
at least one of R, R', $R_1$, $R_2$, $R_{10}$, $R_{20}$, $R_{30}$, and $R_{40}$ may be:
a $C_1$-$C_{30}$ alkyl group; or
a $C_1$-$C_{30}$ alkyl group substituted with at least one deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, or any combination thereof;
a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group; or
a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with at least one deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or any combination thereof.

b10, b20, b30, and b40 in Formula 1 respectively indicate the number of $R_{10}$, $R_{20}$, $R_{30}$, and $R_{40}$ and may each independently be 1, 2, 3, or 4. When b10 is 2 or more, two or more of $R_{10}$(s) may be identical to or different from each other, when b20 is 2 or more, two or more of $R_{20}$(s) may be identical to or different from each other, when b30 is 2 or more, two or more of $R_{30}$(s) may be identical to or different from each other, and when b40 is 2 or more, two or more of $R_{40}$(s) may be identical to or different from each other.

In one or more embodiments, b1, b3, and b4 may each independently be 0, 1, or 2.

When b20 in Formula 1 is 2 or more, two or more $R_{20}$(s) may optionally be linked together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, and $R_{10a}$ may be the same as described in connection with $R_{10}$.

For example, when b20 in Formula 1 is 2 or more, two or more $R_{20}$(s) may optionally be linked together to form a cyclopentane group, a cyclopentadiene group, a furan group, a thiophene group, a pyrrole group, a silole group, an adamantane group, a norbornane group, a norbornene group, a cyclohexane group, a cyclohexene group, a benzene group, a naphthalene group, an indene group, an indole group, a benzofuran group, a benzothiophene group, a benzosilole group, a fluorene group, a carbazole group, a dibenzofuran group, a dibenzothiophene group, or dibenzosilole group, each unsubstituted or substituted with at least one $R_{10a}$.

In Formula 1, i) at least one of $R_1$ and $R_2$ and $R_{30}$ may optionally be linked together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, ii) at least one of $R_1$ and $R_2$ and $R_{40}$ may optionally be linked together to form a $C_1$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, and $R_{10a}$ is the same as described in connection with $R_{10}$.

In one or more embodiments, the organometallic compound may be one of Compounds 1 to 12, but embodiments of the present disclosure are not limited thereto:

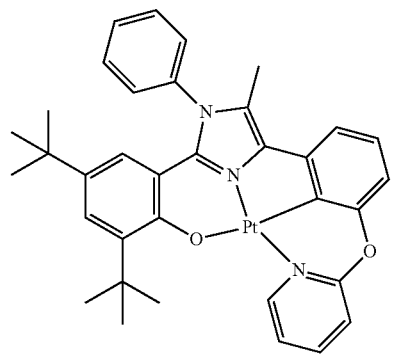

1

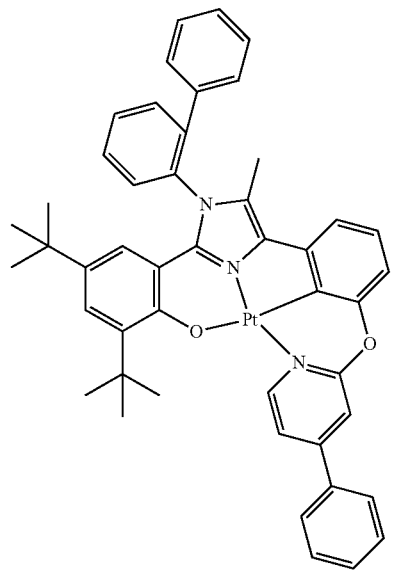

2

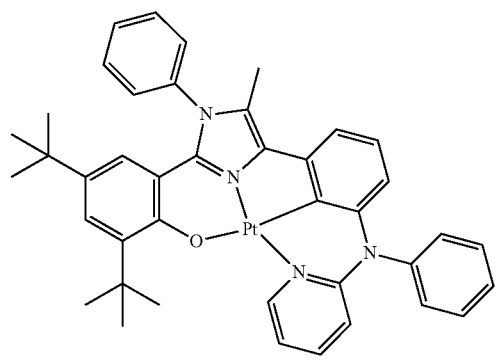

3

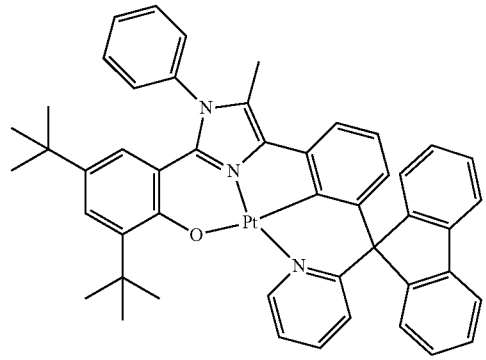

4

-continued
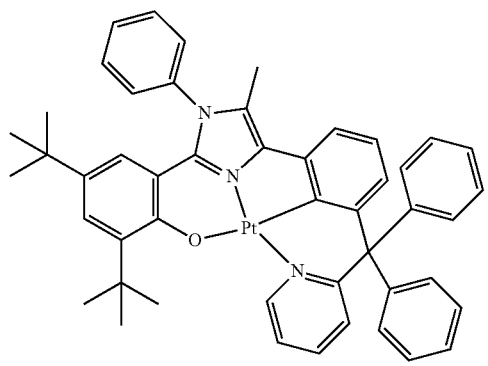
5
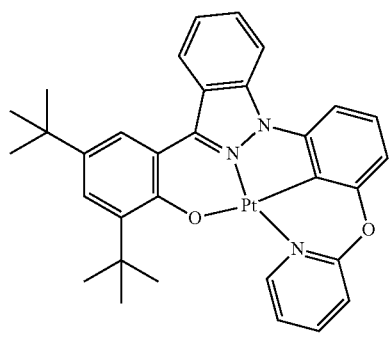
6
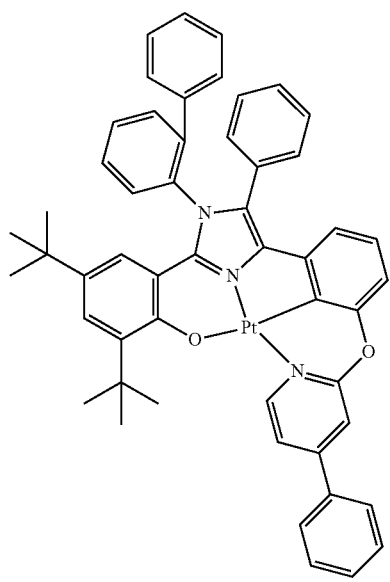
7
-continued
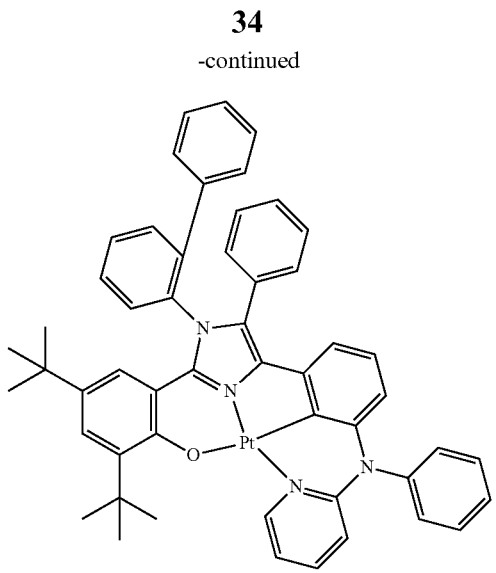
8
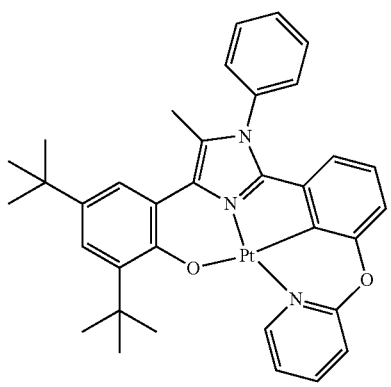
9
10
11

-continued

Compound B

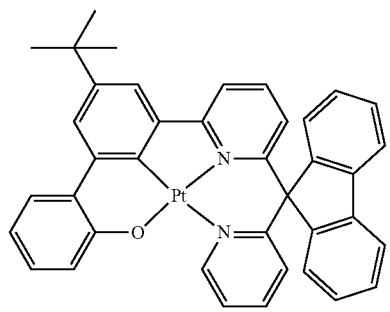

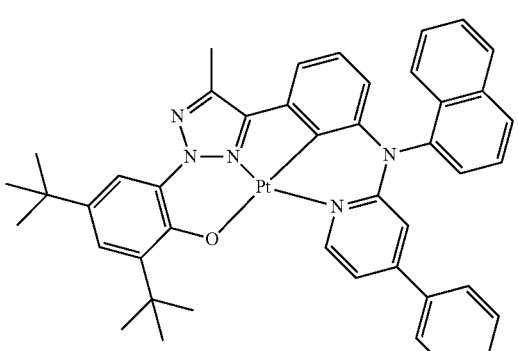

Compound C

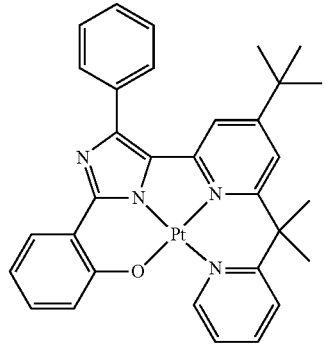

In the organometallic compound represented by Formula 1, a second ring represented by $A_2$ may be an N-containing 5-membered heterocyclic group, and at least one of a third ring represented by $A_3$ and a fourth ring represented by $A_4$ may be covalently bonded to $M_1$ via a C atom.

Although it is not intended to limit embodiments by any theory, i) Compounds A and B, in which a ring corresponding to the second ring of Formula 1 is a 6-membered ring, each show a longer wavelength than the organometallic compound, and thus, the luminescent characteristics of Compounds A and B are different from those of the organometallic compound, and ii) Compounds B and C, in which a ring corresponding to the third ring of Formula 1 and a ring corresponding to the fourth ring of Formula 1 are each linked to $M_1$ via a C atom, charge-transfer characteristics deteriorate and thus efficiency may be decreased.

Compound A

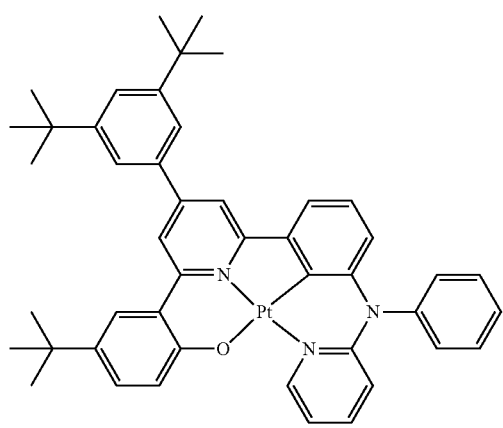

In the organometallic compound represented by Formula 1, the second ring represented by $A_2$ may be an N-containing 5-membered heterocyclic group, and at least one of the third ring represented by $A_3$ and the fourth ring represented by $A_4$ may be covalently bonded to $M_1$ via a C atom. Accordingly, luminescent characteristics and charge-transfer characteristics are excellent. Accordingly, an electronic device using the organometallic compound represented by Formula 1, for example, an organic light-emitting device using the organometallic compound represented by Formula 1 may have excellent luminescent efficiency and/or lifespan characteristics.

For example, the highest occupied molecular orbital (HOMO), lowest unoccupied molecular orbital (LUMO), and singlet ($S_1$) and triplet ($T_1$) energy levels of Compounds 1 to 6 were evaluated by using a DFT method of Gaussian program (structurally optimized at a level of B3LYP, 6-31G (d,p)). Evaluation results are shown in Table 1 below.

TABLE 1

| Compound No. | HOMO (eV) | LUMO (eV) | Band gap | $S_1$ energy level (eV) | $T_1$ energy level (eV) |
|---|---|---|---|---|---|
| 1 | −4.51 | −1.30 | 3.22 | 2.68 | 2.53 |
| 2 | −4.44 | −1.62 | 2.82 | 2.36 | 2.28 |
| 3 | −4.34 | −1.07 | 3.28 | 2.73 | 2.55 |
| 4 | −4.48 | −1.36 | 3.12 | 2.59 | 2.48 |
| 5 | −4.46 | −1.40 | 3.06 | 2.53 | 2.41 |
| 7 | −4.50 | −1.62 | 2.88 | 2.41 | 2.33 |
| A | −4.54 | −1.49 | 3.05 | 2.48 | 2.22 |
| B | −4.42 | −1.61 | 2.81 | 2.24 | 2.04 |
| C | −4.56 | −1.83 | 2.73 | 2.25 | 1.99 |

TABLE 1-continued
| Compound No. | HOMO (eV) | LUMO (eV) | Band gap | S₁ energy level (eV) | T₁ energy level (eV) |
|---|---|---|---|---|---|
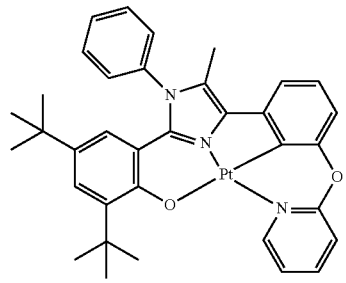
1
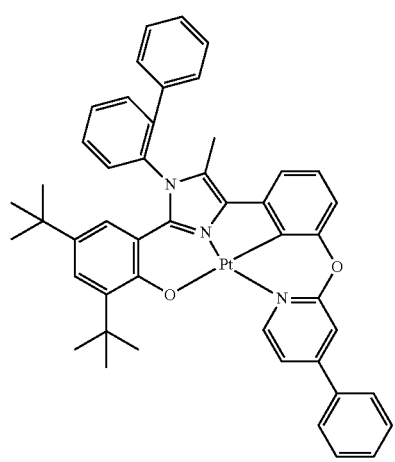
2
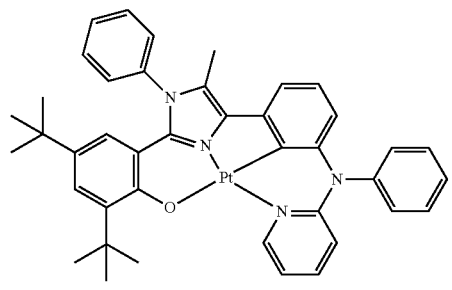
3
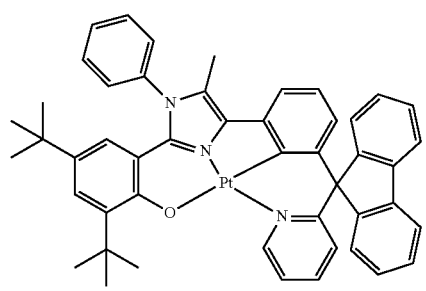
4
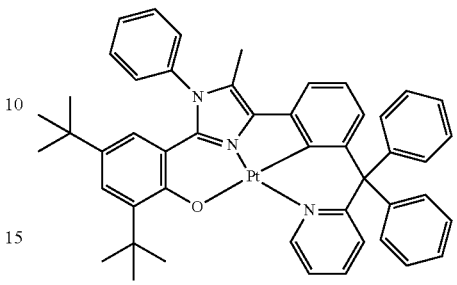
5
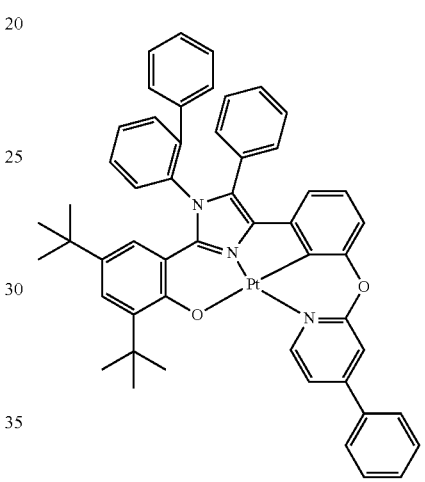
7
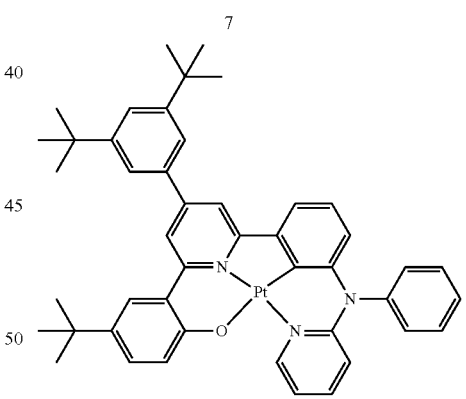
A
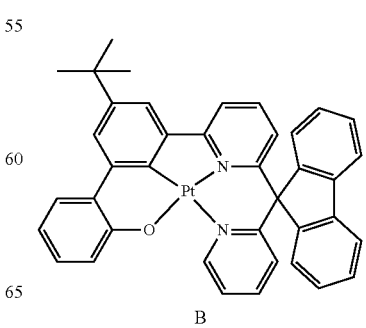
B

TABLE 1-continued

| Compound No. | HOMO (eV) | LUMO (eV) | Band gap | S₁ energy level (eV) | T₁ energy level (eV) |
|---|---|---|---|---|---|

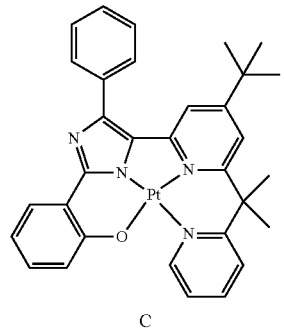

C

From Table 1, it is confirmed that the organometallic compound represented by Formula 1 has such electric characteristics that are suitable for use as a material for an emission layer for an electric device, for example, an organic light-emitting device.

Synthesis methods of the organometallic compound represented by Formula 1 may be recognizable by one of ordinary skill in the art by referring to Synthesis Examples provided below.

Accordingly, the organometallic compound represented by Formula 1 is suitable for use as a material for an organic layer of organic light-emitting device, for example, an emission layer. Thus, another aspect provides an organic light-emitting device including: a first electrode; a second electrode; and an organic layer placed between the first electrode and the second electrode and including an emission layer, and the organic layer includes at least one organometallic compound represented by Formula 1.

The organic light-emitting device may have, due to the inclusion of an organic layer including the organometallic compound represented by Formula 1, a low driving voltage, high efficiency, high power, high quantum efficiency, a long lifespan, a low roll-off ratio, and excellent color purity.

In one or more embodiments, in the organic light-emitting device, the first electrode is an anode, and the second electrode is a cathode, and the organic layer further includes a hole transport region between the first electrode and the emission layer and an electron transport region between the emission layer and the second electrode, and the hole transport region includes a hole injection layer, a hole transport layer, an electron blocking layer, or any combination thereof, and the electron transport region includes a hole blocking layer, an electron transport layer, an electron injection layer, or any combination thereof.

In one or more embodiments, the organometallic compound represented by Formula 1 may be included in the emission layer.

The organometallic compound is included in the emission layer may act as an emitter. For example, an emission layer including the organometallic compound represented by Formula 1 may emit phosphorescent light generated by the transfer of the triplet excitons of the organometallic compound into the ground state.

In one or more embodiments, the emission layer including the organometallic compound represented by Formula 1 may further include a host. The host may be any host, and details of the host may be the same as described above. The amount of the host in the emission layer may be greater than the amount of the organometallic compound represented by Formula 1.

In one or more embodiments, the emission layer may include a host and a dopant, the host may be any host, and the dopant may include the organometallic compound represented by Formula 1. The emission layer may emit phosphorescent light generated by the transfer of triplet excitons of the organometallic compound, which acts as a dopant, to the ground state.

In one or more embodiments, the emission layer may emit green light having a maximum emission wavelength of about 490 nm to about 580 nm, for example, about 500 nm to about 570 nm.

In one or more embodiments, the emission layer may emit green light having a maximum emission wavelength of about 580 nm to about 780 nm, for example, about 590 nm to about 750 nm.

The expression "(an organic layer) includes at least one of organometallic compounds" used herein may include a case in which "(an organic layer) includes identical organometallic compounds represented by Formula 1" and a case in which "(an organic layer) includes two or more different organometallic compounds represented by Formula 1".

For example, the organic layer may include, as the organometallic compound, only Compound 1. In this regard, Compound 1 may exist in an emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 all may exist in an emission layer).

The term "organic layer" used herein refers to a single layer and/or a plurality of layers between the first electrode and the second electrode of the organic light-emitting device. The "organic layer" may include, in addition to an organic compound, an organometallic complex including metal.

FIGURE is a schematic cross-sectional view of an organic light-emitting device 10 according to an embodiment. Hereinafter, the structure of an organic light-emitting device according to an embodiment and a method of manufacturing an organic light-emitting device according to an embodiment will be described in connection with FIGURE. The organic light-emitting device 10 includes a first electrode 11, an organic layer 15, and a second electrode 19, which are sequentially stacked.

A substrate may be additionally located under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may be materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide (SnO$_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO, but the structure of the first electrode 11 is not limited thereto.

The organic layer 15 is located on the first electrode 11.

The organic layer 15 may include a hole transport region, an emission layer, and an electron transport region.

The hole transport region may be between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, wherein, for each structure, each layer is sequentially stacked in this stated order from the first electrode 11.

When the hole transport region includes a hole injection layer (HIL), the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one m-MTDATA, TDATA, 2-TNATA, NPB, β-NPB, TPD, Spiro-TPD, Spiro-NPB, methylated-NPB, TAPC, HMTPD, 4,4',4''-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or any combination thereof:

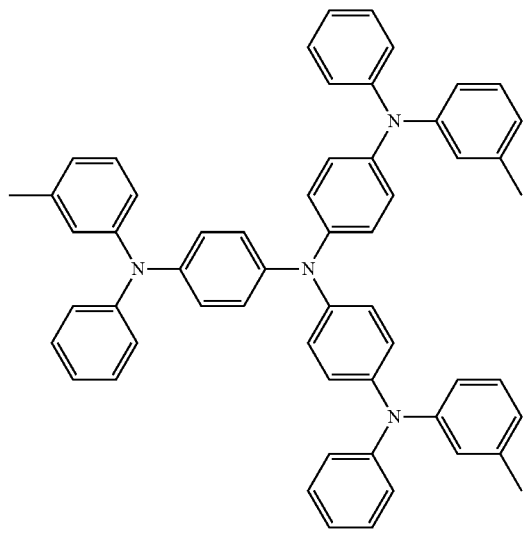

m-MTDATA

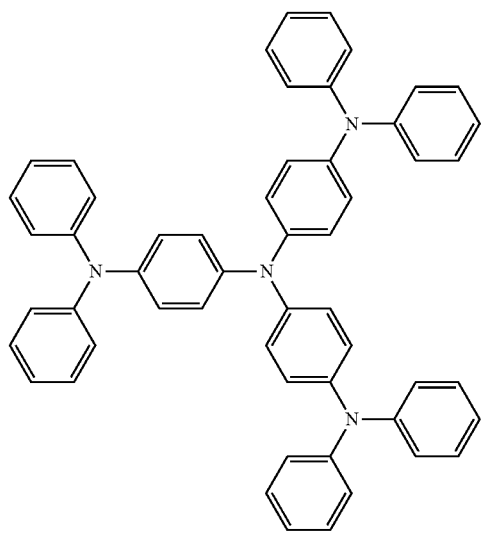

TDATA

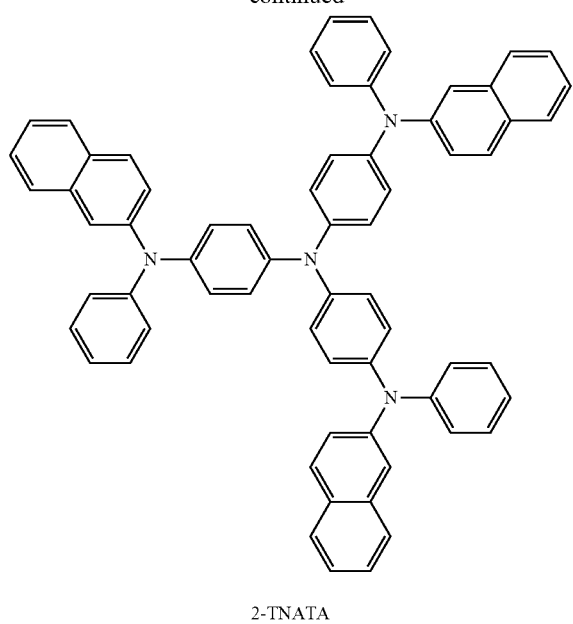
2-TNATA
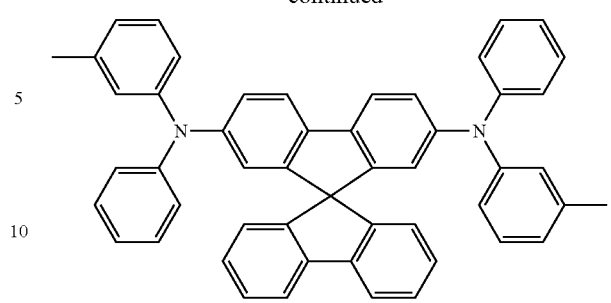
Spiro-TPD
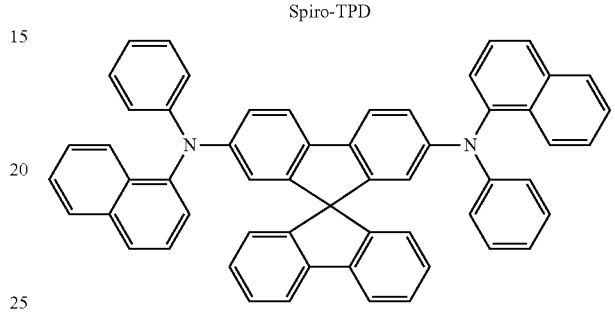
Spiro-NPB
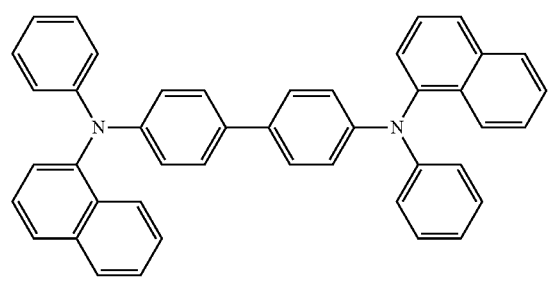
NPB
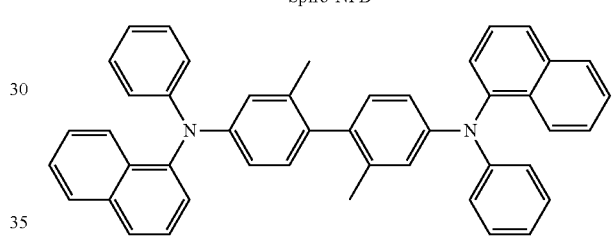
methylated NPB
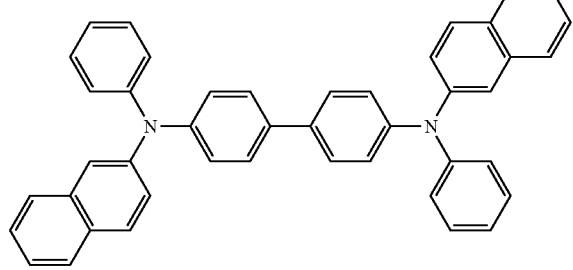
β-NPB
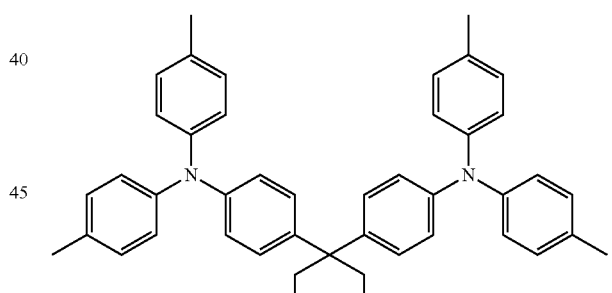
TAPC
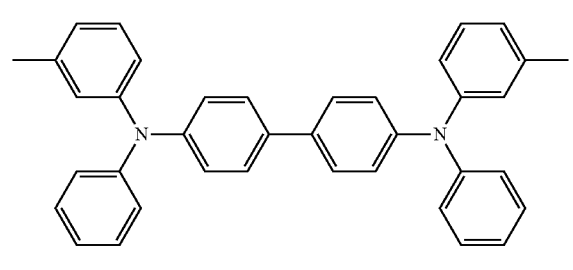
TPD
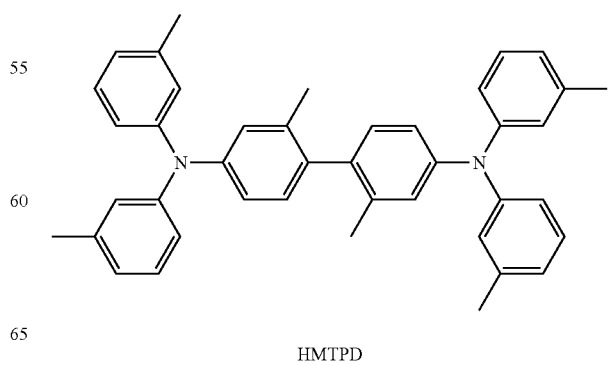
HMTPD Formula 201

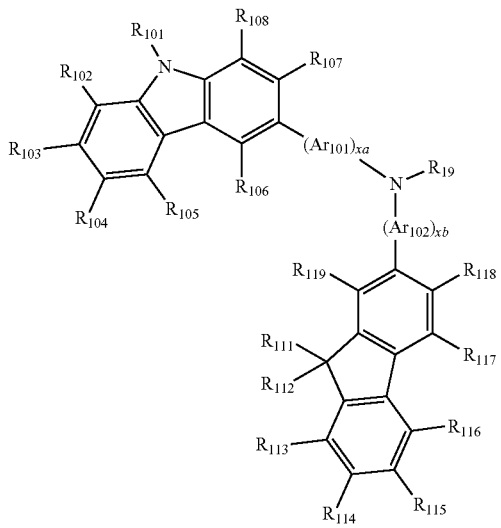

Formula 202

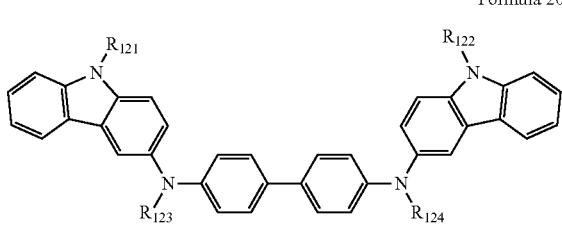

$Ar_{101}$ to $Ar_{102}$ in Formula 201 may each independently be:
a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or
a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with at least one deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic condensed heteropolycyclic group, or any combination thereof.

xa and xb in Formula 201 may each independently be an integer from 0 to 5, or 0, 1, or 2. For example, xa may be 1 and xb may be 0, but xa and xb are not limited thereto.

$R_{101}$ to $R_{108}$, $R_{111}$ to $R_{119}$ and $R_{121}$ to $R_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group (for example, a methyl group, an ethyl group, a propyl group, a butyl group, a pentyl group, a hexyl group, and so on), or a $C_1$-$C_{10}$ alkoxy group (for example, a methoxy group, an ethoxy group, a propoxy group, a butoxy group, a pentoxy group, and so on);

a $C_1$-$C_{10}$ alkyl group or a $C_1$-$C_{10}$ alkoxy group, each substituted with at least one deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, or any combination thereof;

a phenyl group, a naphthyl group, an anthracenyl group, a fluorenyl group, or a pyrenyl group; and a phenyl group, a naphthyl group, an anthracenyl group, a fluorenyl group, or a pyrenyl group, each substituted with at least one deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, or any combination thereof, but embodiments of the present disclosure are not limited thereto.

$R_{109}$ in Formula 201 may be:
a phenyl group, a naphthyl group, an anthracenyl group, or a pyridinyl group; and
a phenyl group, a naphthyl group, an anthracenyl group, or a pyridinyl group, each substituted with at least one a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

According to an embodiment, the compound represented by Formula 201 may be represented by Formula 201A below, but embodiments of the present disclosure are not limited thereto:

Formula 201A
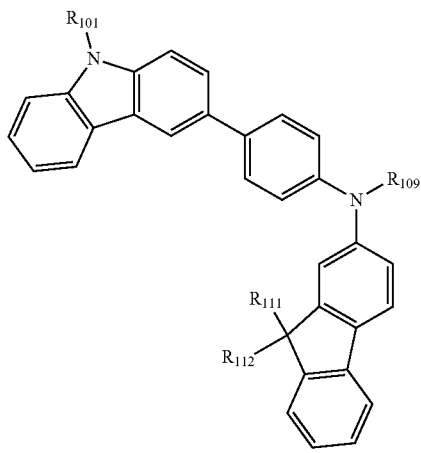
$R_{11}$, $R_{111}$, $R_{112}$, and $R_{109}$ in Formula 201A may be understood by referring to the description provided herein.
For example, the compound represented by Formula 201, and the compound represented by Formula 202 may include a compound of HT1 to HT20 illustrated below, but are not limited thereto:
HT1
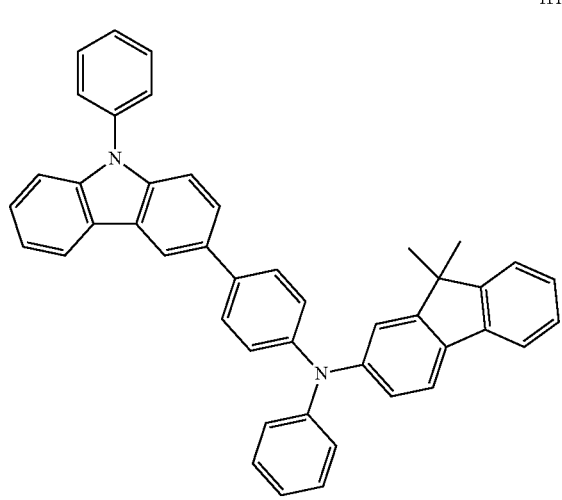
HT2
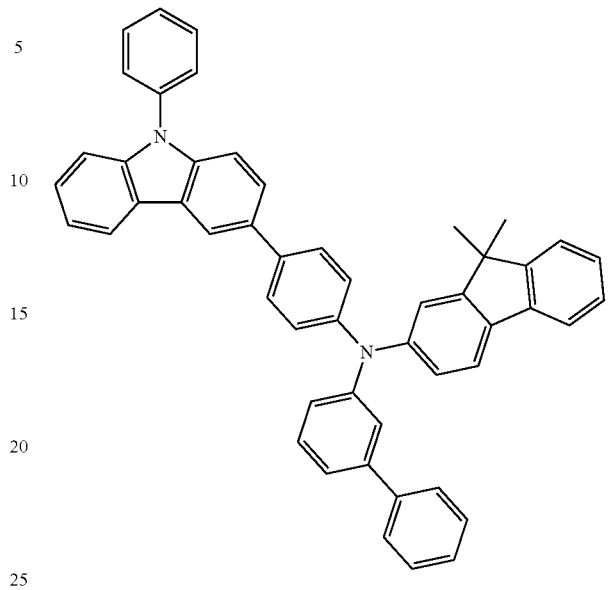
HT3
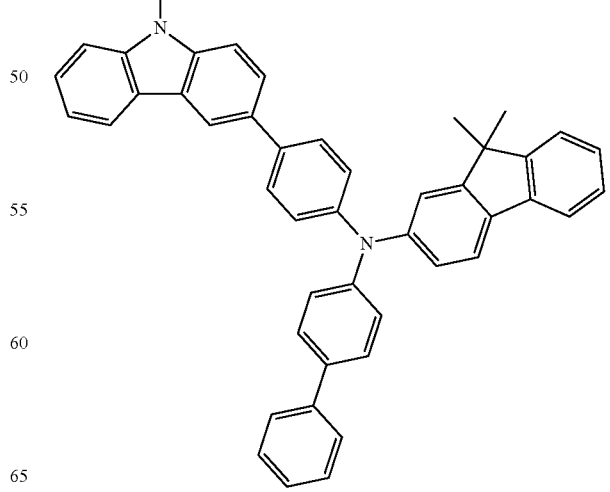

HT4
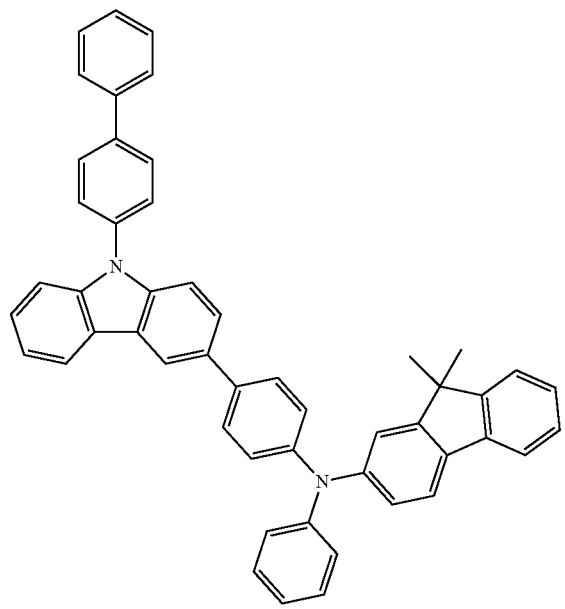
HT6
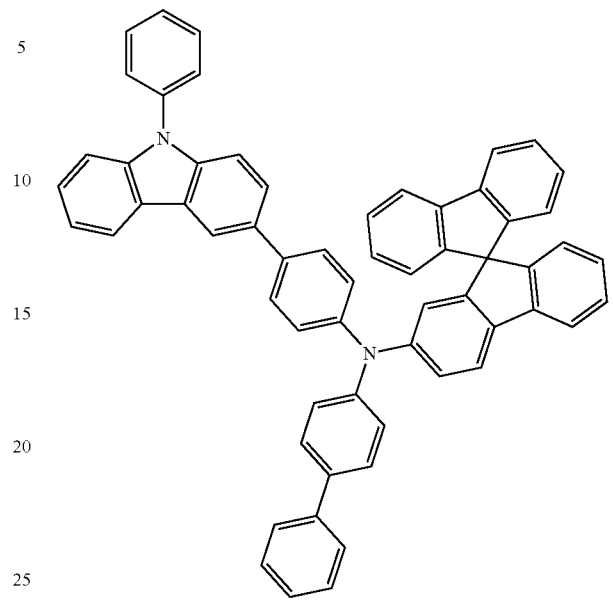
HT5
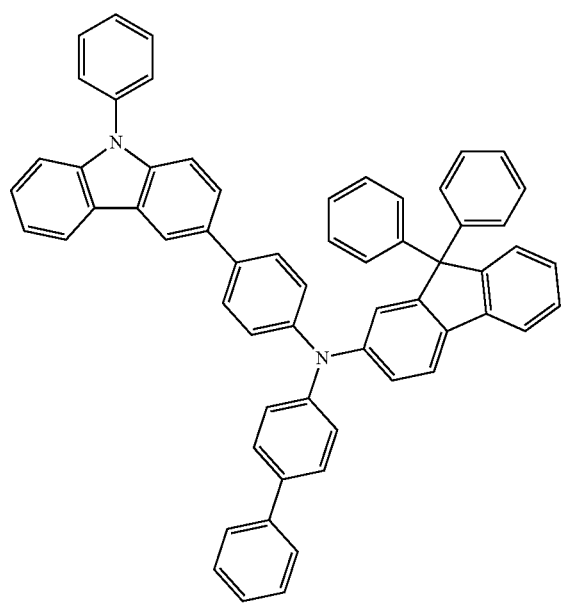
HT7
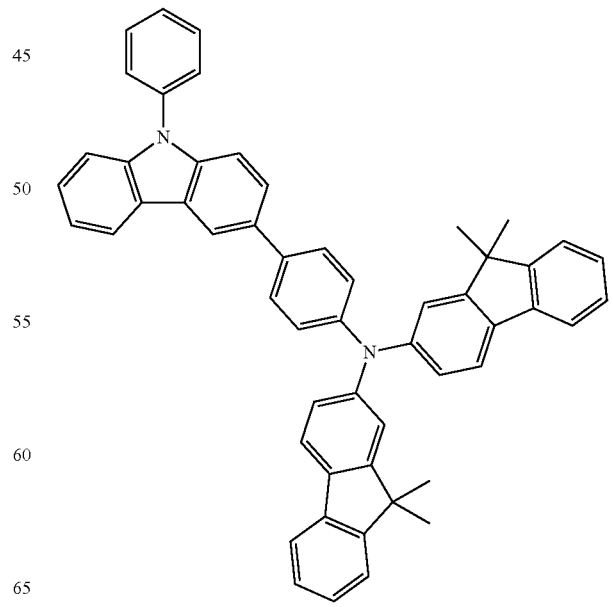

HT8
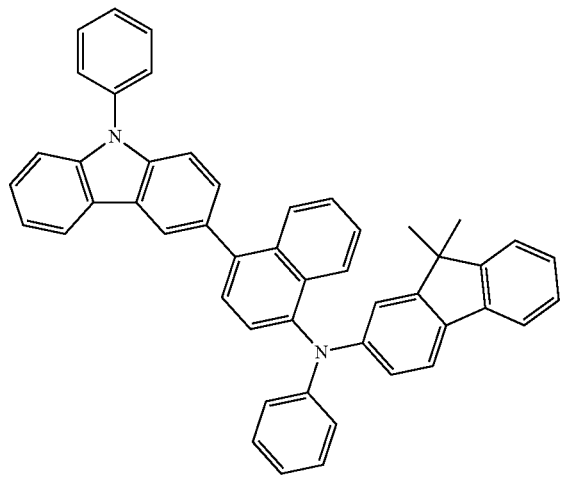
HT10
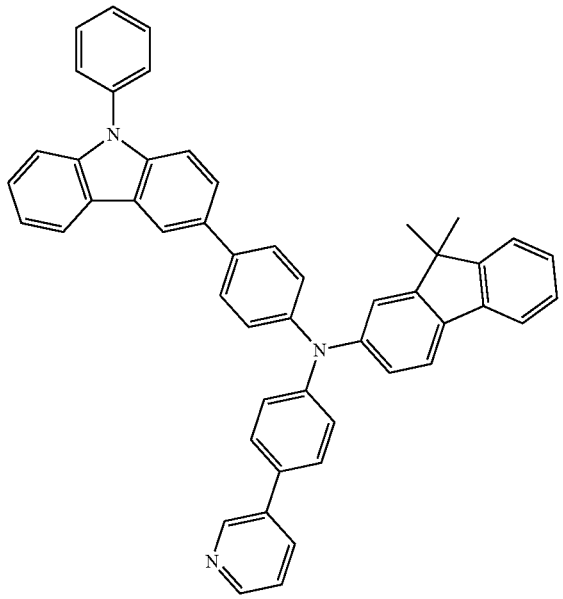
HT9
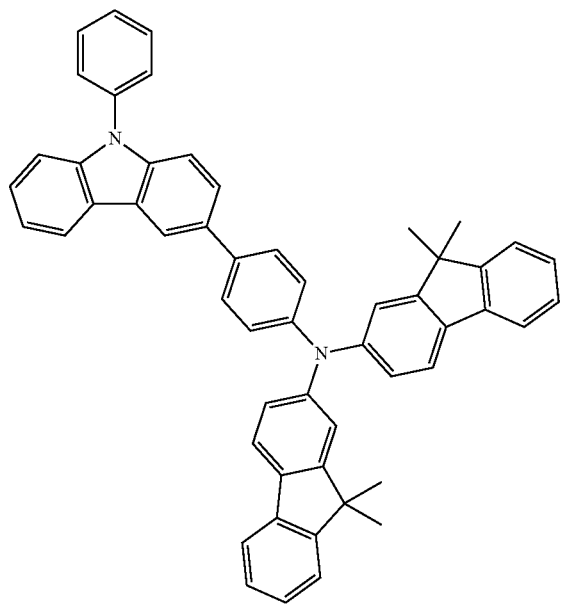
HT11
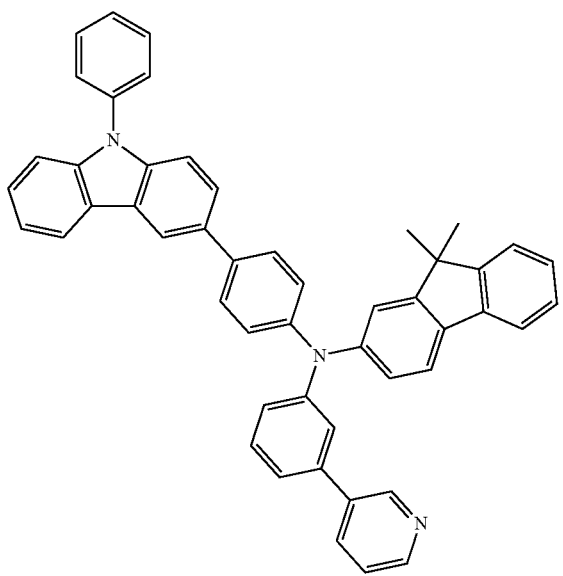

HT12
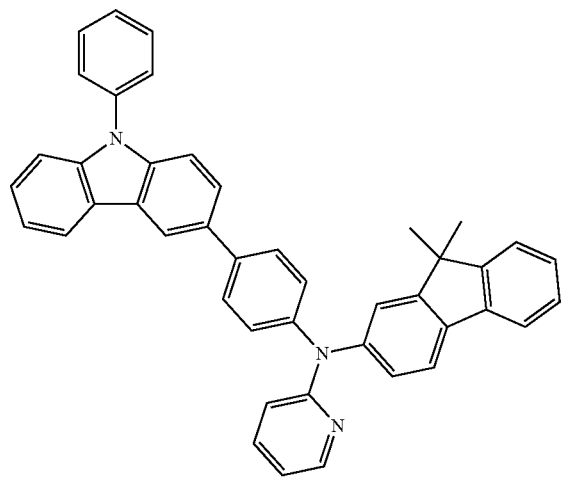
HT13
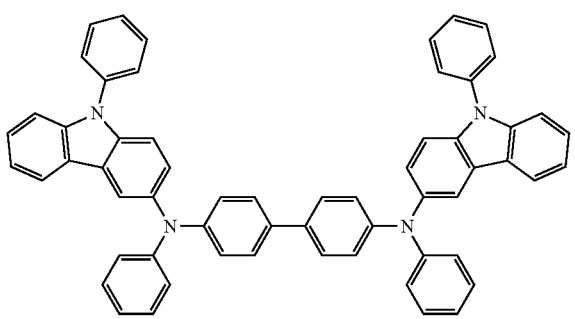
HT14
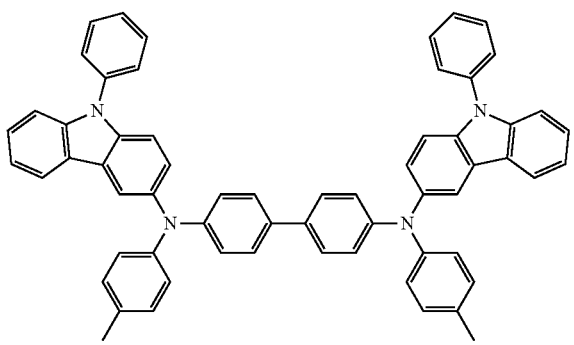
HT15
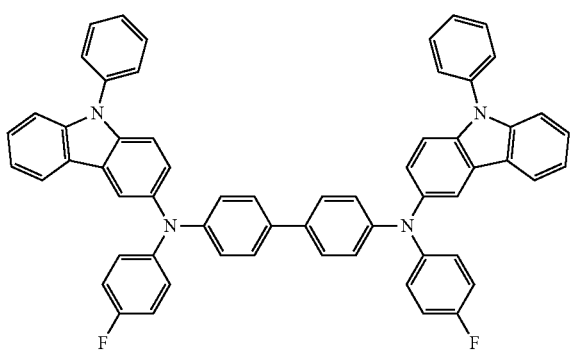
HT16
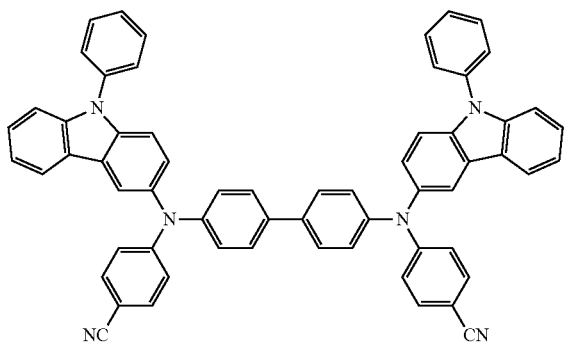
HT17
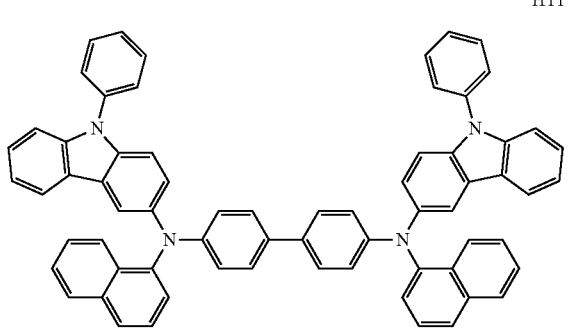
HT18
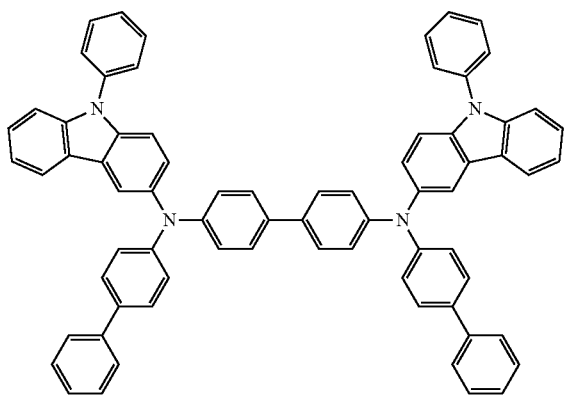
HT19
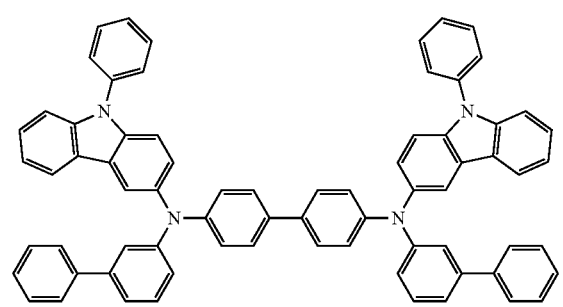

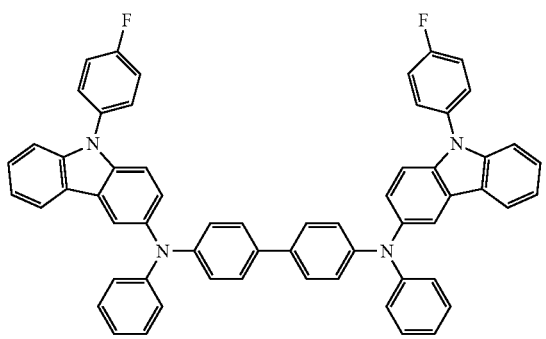

HT20

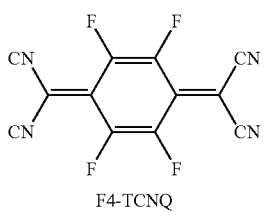

F4-TCNQ

A thickness of the hole transport region may be from about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be a quinone derivative, a metal oxide, a cyano group-containing compound, or any combination thereof, but embodiments of the present disclosure are not limited thereto. Examples of the p-dopant are: a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as Compound HT-D1 below, but are not limited thereto.

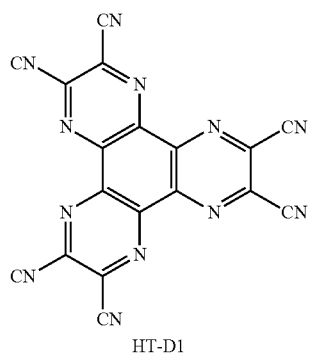

HT-D1

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer (EML) may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the hole transport layer.

Meanwhile, when the hole transport region includes an electron blocking layer, a material for the electron blocking layer may be materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include at least one TPBi, TBADN, ADN (also referred to as "DNA"), CBP, CDBP, TCP, mCP, Compound H50, Compound H51, or any combination thereof:

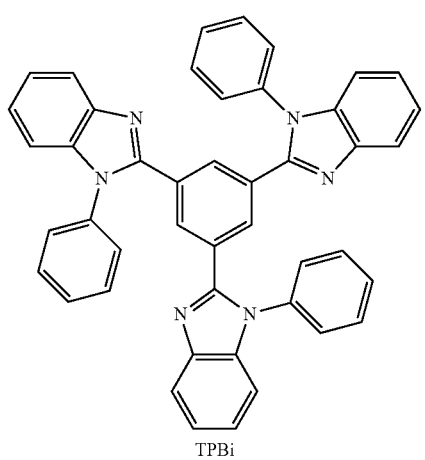

TPBi

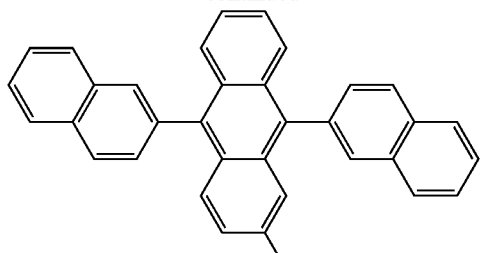
TBADN

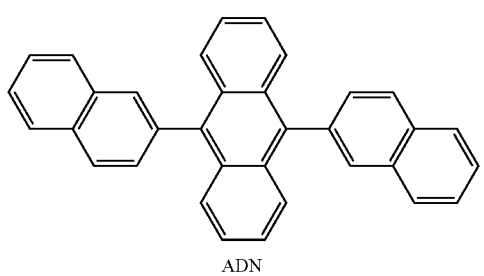
ADN

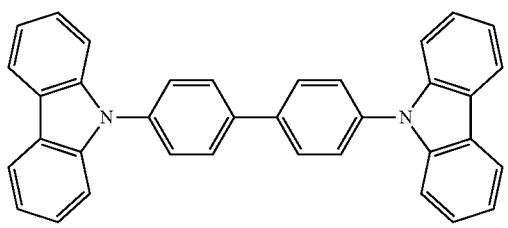
CBP

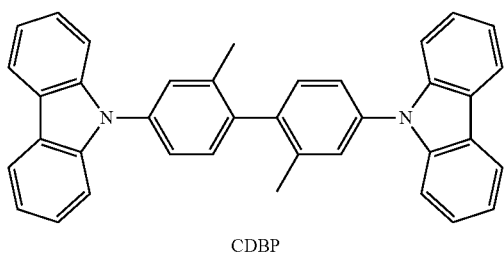
CDBP

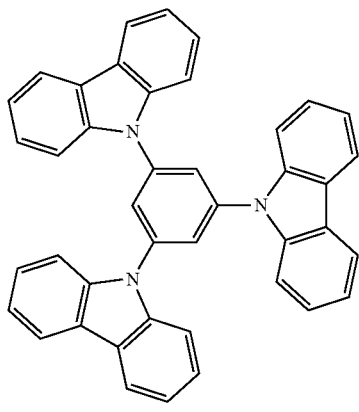
TCP

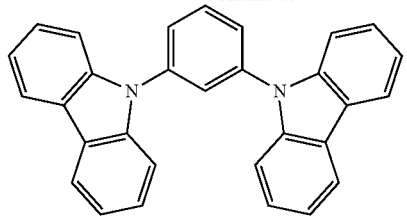
mCP

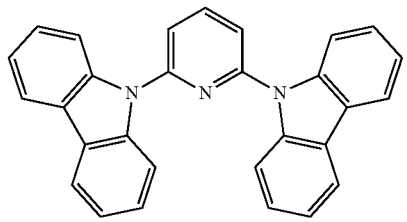
H50

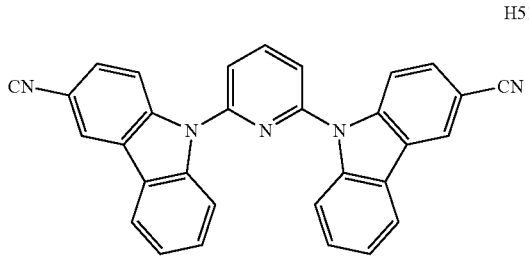
H51

In one or more embodiments, the host may further include a compound represented by Formula 301 below.

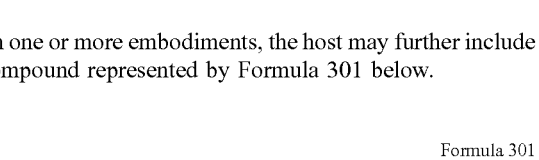

Formula 301

$Ar_{111}$ and $Ar_{112}$ in Formula 301 may each independently be:
- a phenylene group, a naphthylene group, a phenanthrenylene group, or a pyrenylene group; or
- a phenylene group, a naphthylene group, a phenanthrenylene group, or a pyrenylene group, each substituted with at least one a phenyl group, a naphthyl group, an anthracenyl group, or any combination thereof.

$Ar_{113}$ to $Ar_{116}$ in Formula 301 may each independently be:
- a $C_1$-$C_{10}$ alkyl group, a phenyl group, a naphthyl group, a phenanthrenyl group, or a pyrenyl group; or
- a phenyl group, a naphthyl group, a phenanthrenyl group, or a pyrenyl group, each substituted with at least one a phenyl group, a naphthyl group, an anthracenyl group, or any combination thereof.

g, h, i, and j in Formula 301 may each independently be an integer from 0 to 4, and may be, for example, 0, 1, or 2.

$Ar_{113}$ and $Ar_{116}$ in Formula 301 may each independently be:
- a $C_1$-$C_{10}$ alkyl group, substituted with at least one a phenyl group, a naphthyl group, an anthracenyl group, or any combination thereof;
- a phenyl group, a naphthyl group, an anthracenyl group, a pyrenyl, a phenanthrenyl group, a fluorenyl group, or any combination thereof;
- a phenyl group, a naphthyl group, an anthracenyl group, a pyrenyl group, a phenanthrenyl group, or a fluorenyl group, each substituted with at least one deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_2$-$C_{60}$ alkenyl group, a $C_2$-$C_{60}$ alkynyl group, a $C_1$-$C_{10}$ alkoxy group, a phenyl group, a naphthyl group, an anthracenyl group, a pyrenyl group, a phenanthrenyl group, a fluorenyl group, or any combination thereof; or

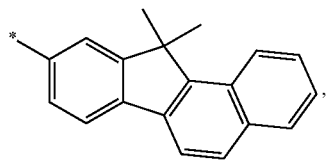 [SMILES: *c1ccc2c(c1)C(C)(C)c1c-2ccc2ccccc12]

but embodiments of the present disclosure are not limited thereto.

In one or more embodiments, the host may include a compound represented by Formula 302 below:

Formula 302

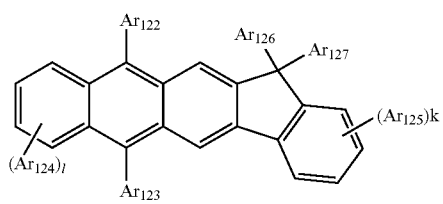

$Ar_{122}$ to $Ar_{125}$ in Formula 302 are the same as described in detail in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

k and l in Formula 302 may each independently be an integer from 0 to 4. For example, k and l may be 0, 1, or 2.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be located on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, and the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, BAlq, or any combination thereof but embodiments of the present disclosure are not limited thereto.

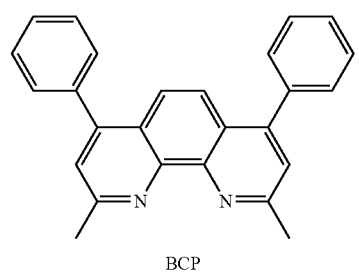

BCP

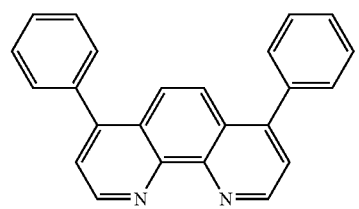

Bphen

A thickness of the hole blocking layer may be in a range of about 20 Å to about 1,000 Å, for example, about 30 Å to about 300 Å. When the thickness of the hole blocking layer is within these ranges, the hole blocking layer may have excellent hole blocking characteristics without a substantial increase in driving voltage.

The electron transport layer may further include at least one BCP, Bphen, Alq3, BAlq, TAZ, NTAZ, or any combination thereof.

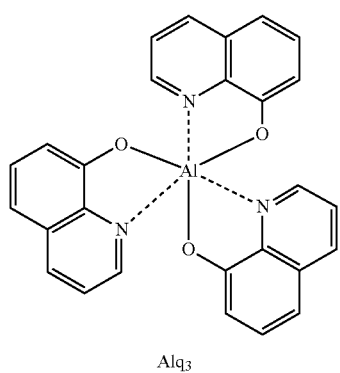
Alq₃
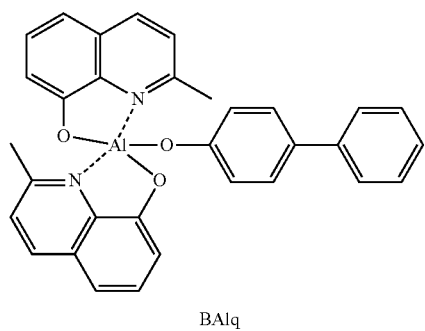
BAlq
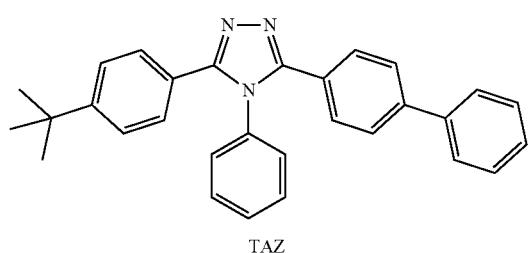
TAZ
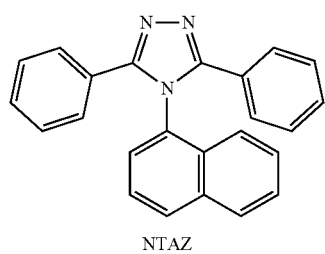
NTAZ
In one or more embodiments, the electron transport layer may include at least one of ET1 to ET25, but are not limited thereto:
ET1
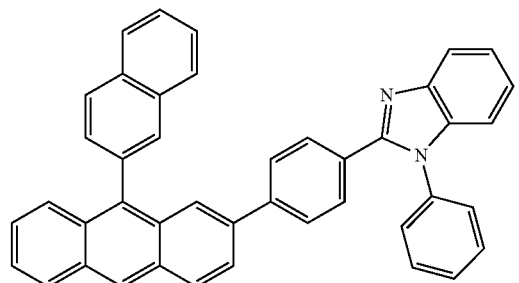
ET2
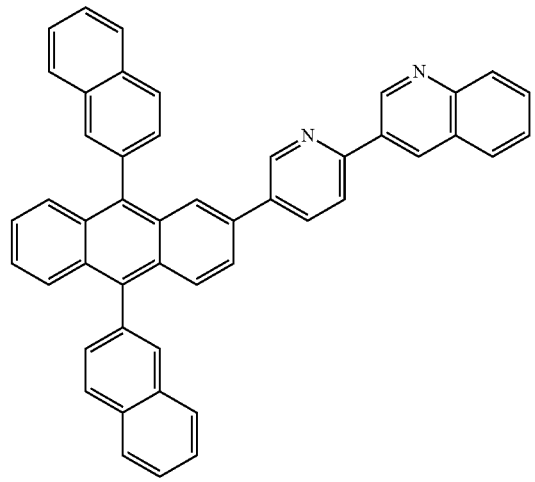
ET3

ET4
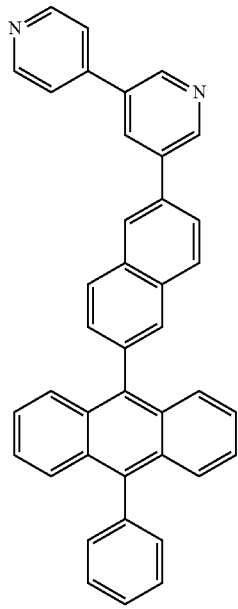
ET7
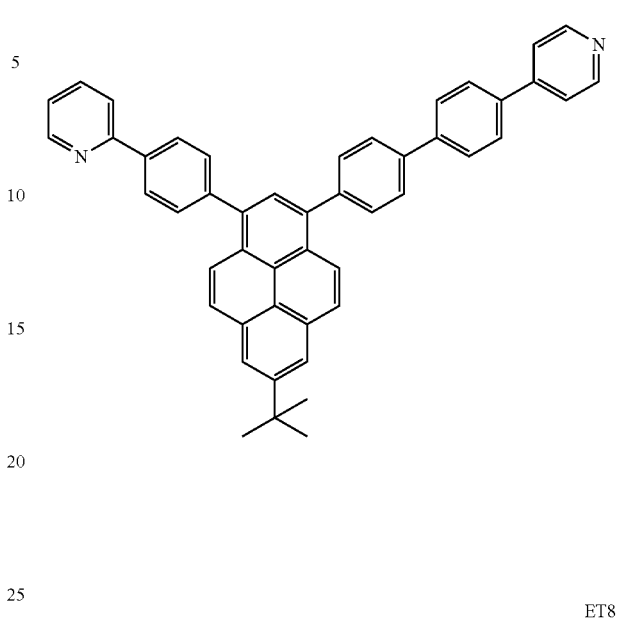
ET5
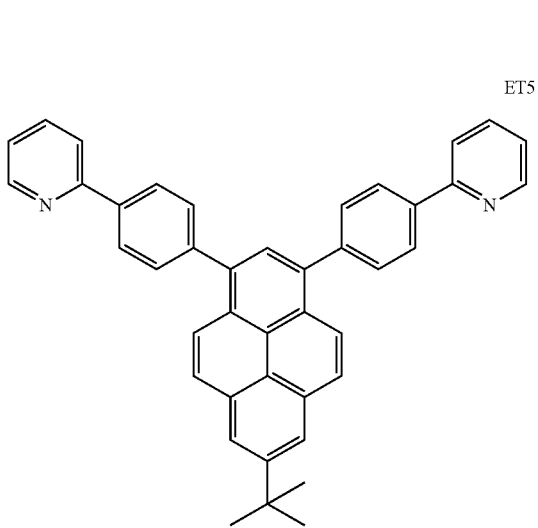
ET8
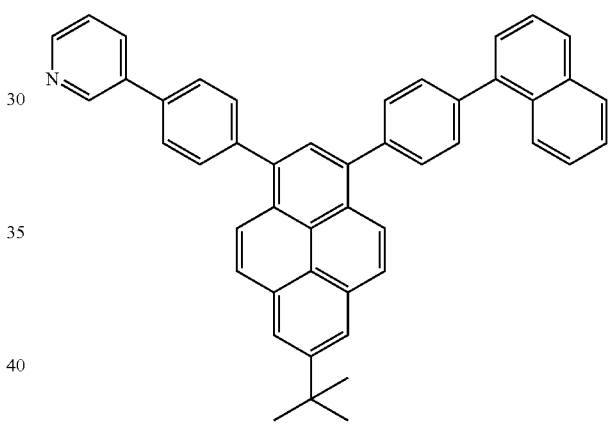
ET6
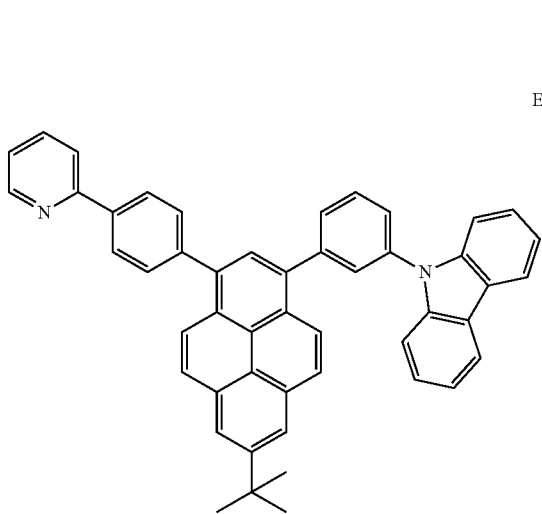 [SMILES: CC(C)(C)c1cc2ccc3c(-c4ccc(-c5cccnc5)cc4)cc(-c4cccc(-n5c6ccccc6c6ccccc65)c4)c4ccc(c1)c2c34]
ET9
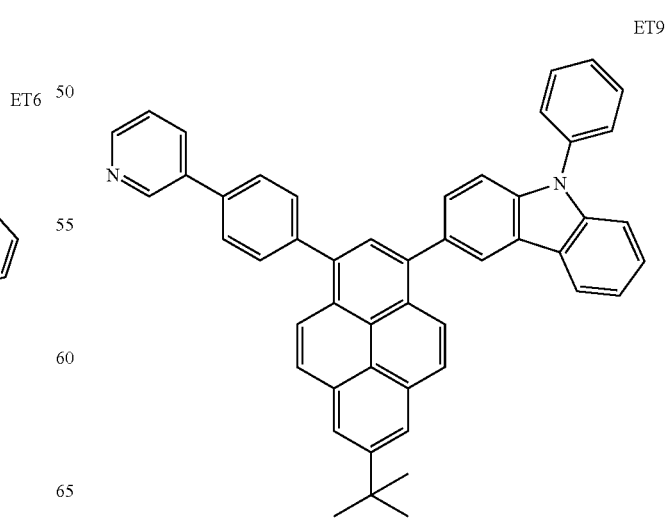

ET10
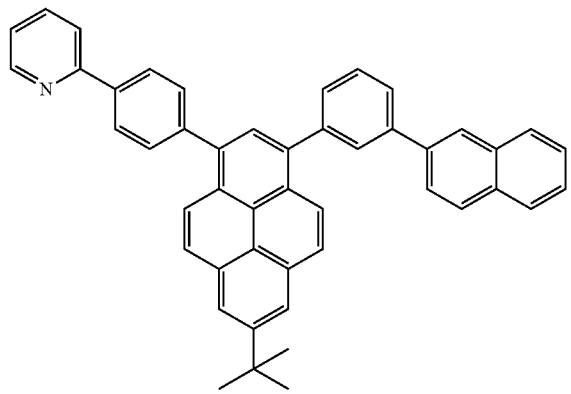
ET11
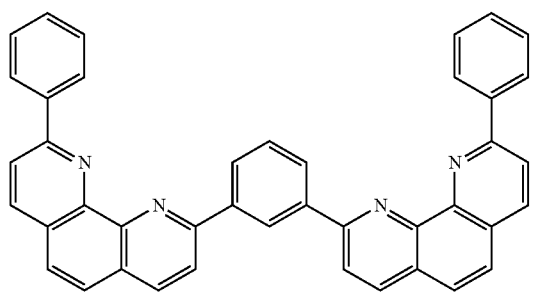
ET12
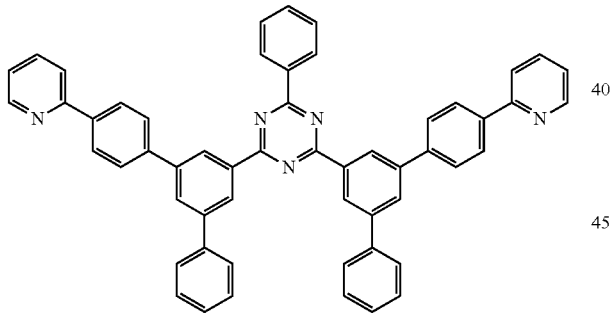
ET13
ET14
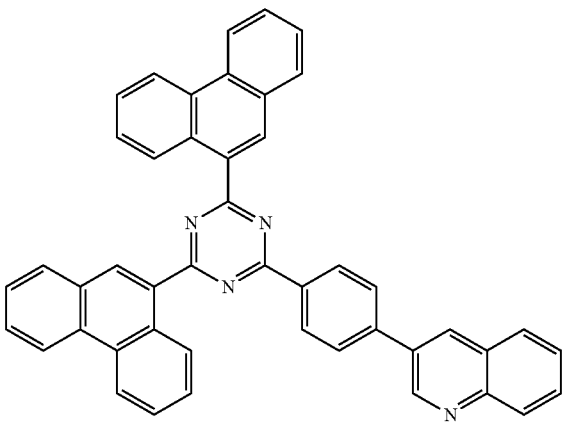
ET15
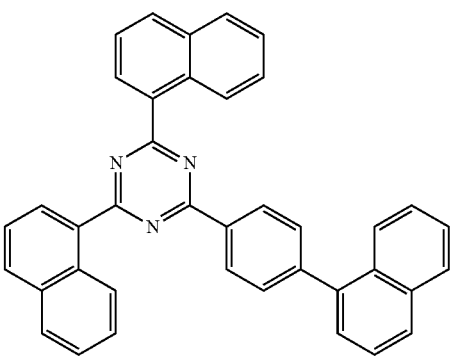
ET16
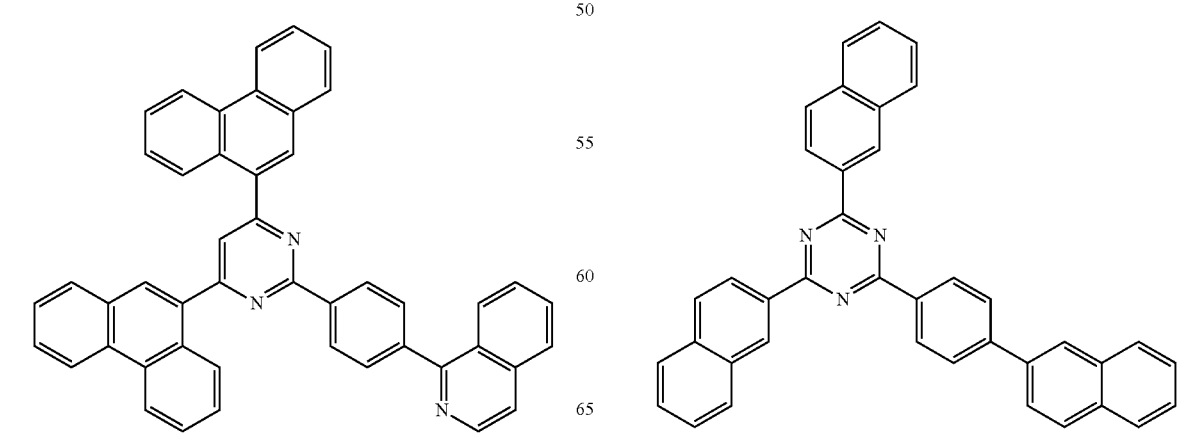

ET17
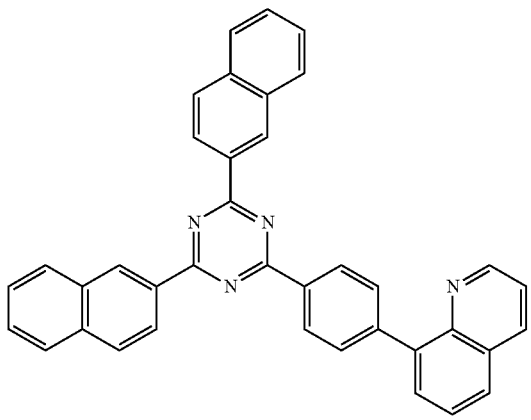
ET20
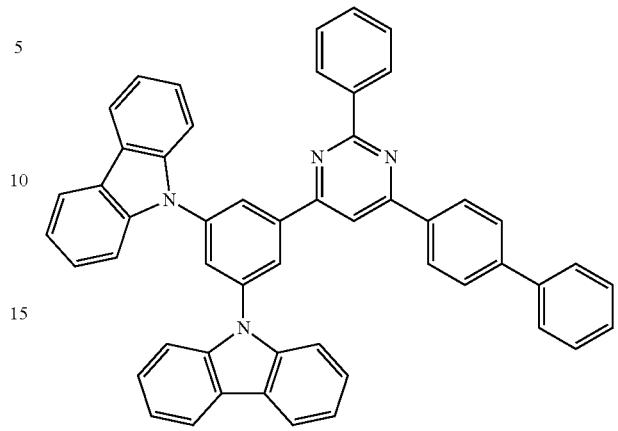
ET18
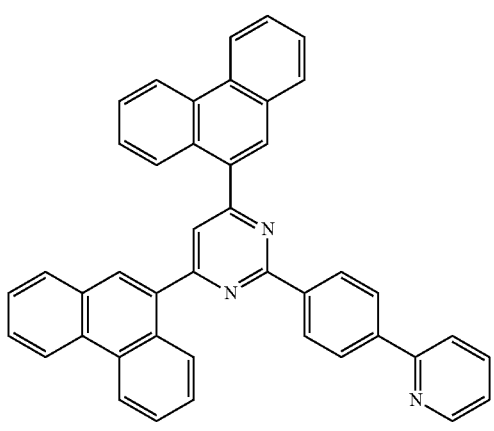
ET21
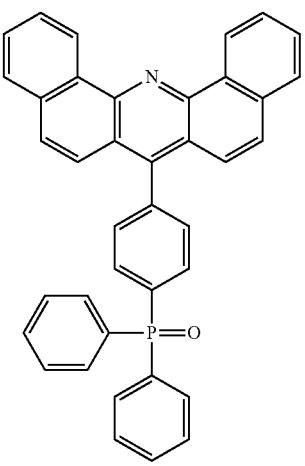
ET19
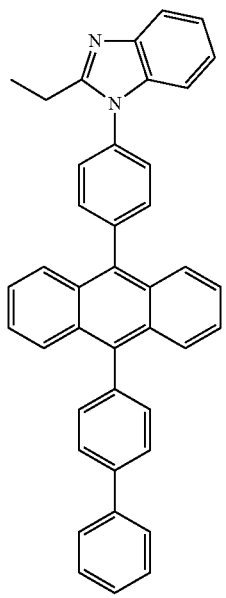
ET22
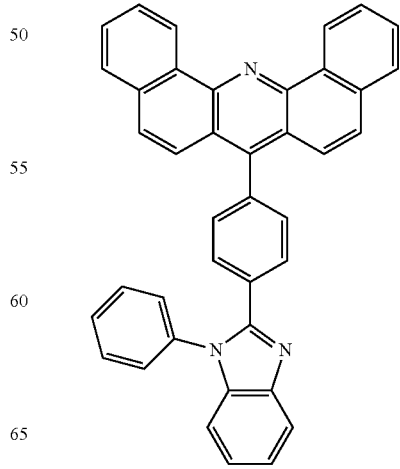

ET23

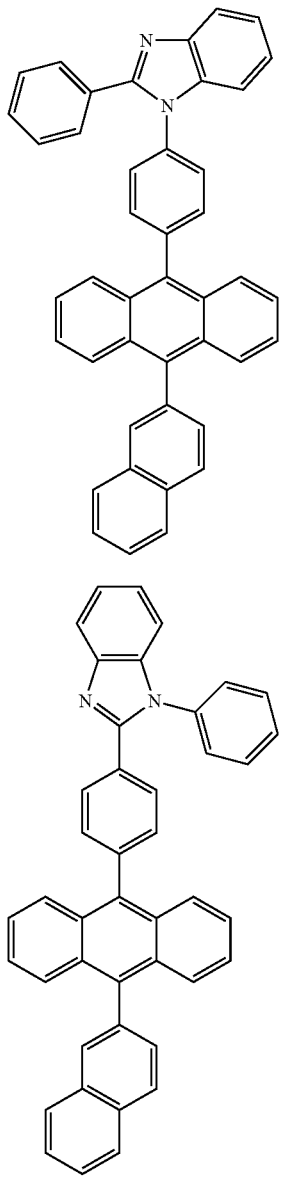

ET24

ET25

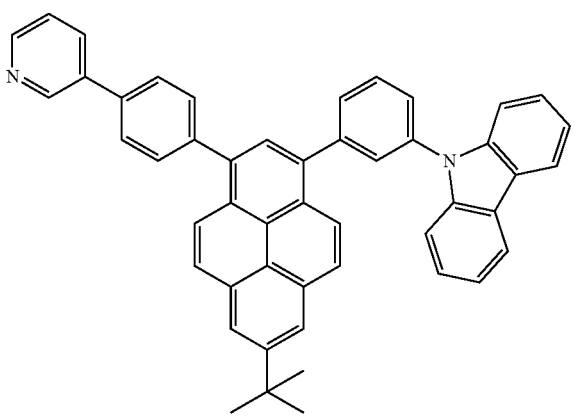

A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium 8-hydroxyquinolate, LiQ) or ET-D2.

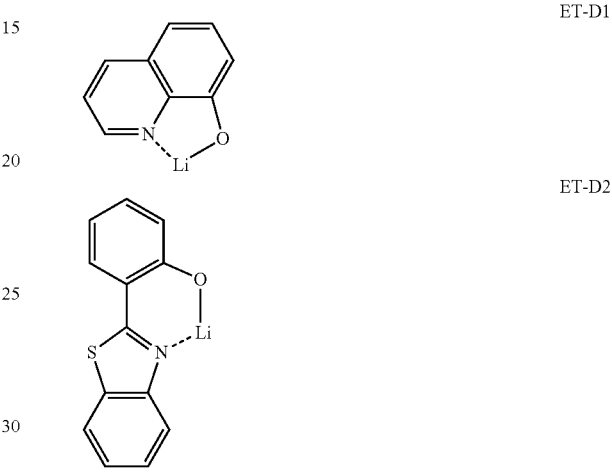

ET-D1

ET-D2

The electron transport region may include an electron injection layer (EIL) that promotes the flow of electrons from the second electrode 19 thereinto.

The electron injection layer may include at least one LiF, NaCl, CsF, $Li_2O$, BaO, or any combination thereof.

A thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

The second electrode 19 may be located on the organic layer 15. The second electrode 19 may be a cathode. A material for forming the second electrode 19 may be metal, an alloy, an electrically conductive compound, or any combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be formed as the material for forming the second electrode 19. To manufacture a top-emission type light-emitting device, a transmissive electrode formed using ITO or IZO may be used as the second electrode 19.

Hereinbefore, the organic light-emitting device has been described with reference to FIGURE, but embodiments of the present disclosure are not limited thereto.

Another aspect provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group.

The term "$C_1$-$C_{60}$ alkylene group" used herein refers to a divalent group having the same structure as that of the $C_1$-$C_{60}$ alkyl group.

The term "$C_1$-$C_{60}$ alkoxy group" used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" used herein refers to a divalent group having the same structure as that of the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as that of the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as that of the $C_3$-$C_{10}$ cycloalkyl group.

The term "$C_1$-$C_{10}$ heterocycloalkyl group" as used herein refers to a monovalent saturated monocyclic group having at least one heteroatom N, O, P, Si, and S as a ring-forming atom and 1 to 10 carbon atoms, and examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group that has at least one N, O, P, Si, B, Se, Ge, Te, S, or any combination thereof as a ring-forming atom, 2 to 10 carbon atoms, and at least one carbon-carbon double bond in its ring. Examples of the $C_2$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_2$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other. The $C_7$-$C_0$ alkylaryl group refers to a $C_6$-$C_{60}$ aryl group substituted with at least one $C_1$-$C_{10}$ alkyl group.

The term "$C_1$-$C_{60}$ heteroaryl group" as used herein refers to a monovalent group having a carbocyclic aromatic system that has at least one N, O, P, Si, B, Se, Ge, Te, S, or any combination thereof as a ring-forming atom, and 1 to 60 carbon atoms. The term "$C_1$-$C_{10}$ heteroarylene group" as used herein refers to a divalent group having a carbocyclic aromatic system that has at least one N, O, P, B, Se, Ge, Te, S, or any combination thereof as a ring-forming atom, and 1 to 60 carbon atoms. Examples of the $C_1$-$C_{10}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the rings may be fused to each other. The $C_2$-$C_{60}$ alkylheteroaryl group refers to a $C_1$-$C_{10}$ heteroaryl group substituted with at least one $C_1$-$C_{10}$ alkyl group.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom N, O, P, Si, and S, other than carbon atoms, as a ring-forming atom, and no aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one N, O, Si, P, B, Se, Ge, Te, S, or any combination thereof, other than 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_1$-$C_{30}$ heterocyclic group, the substituted $C_1$-$C_{10}$ alkyl group, the substituted $C_2$-$C_{60}$ alkenyl group, the substituted $C_2$-$C_{60}$ alkynyl group, the substituted $C_1$-$C_{10}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_0$ alkylaryl group, the substituted $C_6$-$C_{60}$ aryloxy group, the substituted $C_6$-$C_{60}$ arylthio group, the substituted $C_1$-$C_{10}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may be:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), —P(=O)($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each substituted with at least one deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(=O)($Q_{28}$)($Q_{29}$), or any combination thereof; or —N($Q_{31}$)($Q_{32}$), —Si($Q_{33}$)($Q_{34}$)($Q_{35}$), —B($Q_{36}$)($Q_{37}$), or —P(=O)($Q_{38}$)($Q_{39}$), wherein $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_1$-$C_{60}$ alkyl group substituted with at least one deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryl group substituted with at least one deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group.

Hereinafter, a compound and an organic light-emitting device according to embodiments are described in detail with reference to Synthesis Example and Examples.

However, the organic light-emitting device is not limited thereto. The wording "'B' was used instead of 'A'" used in describing Synthesis Examples means that an amount of 'A' used was identical to an amount of 'B' used, in terms of a molar equivalent.

EXAMPLES

Synthesis Example 1: Synthesis of Compound 7

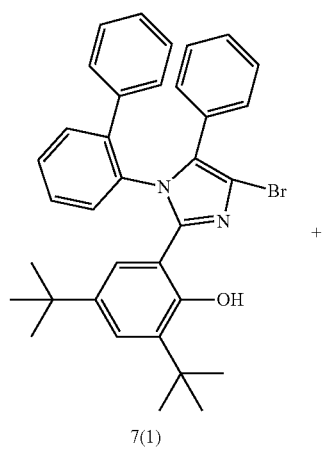

7(1)

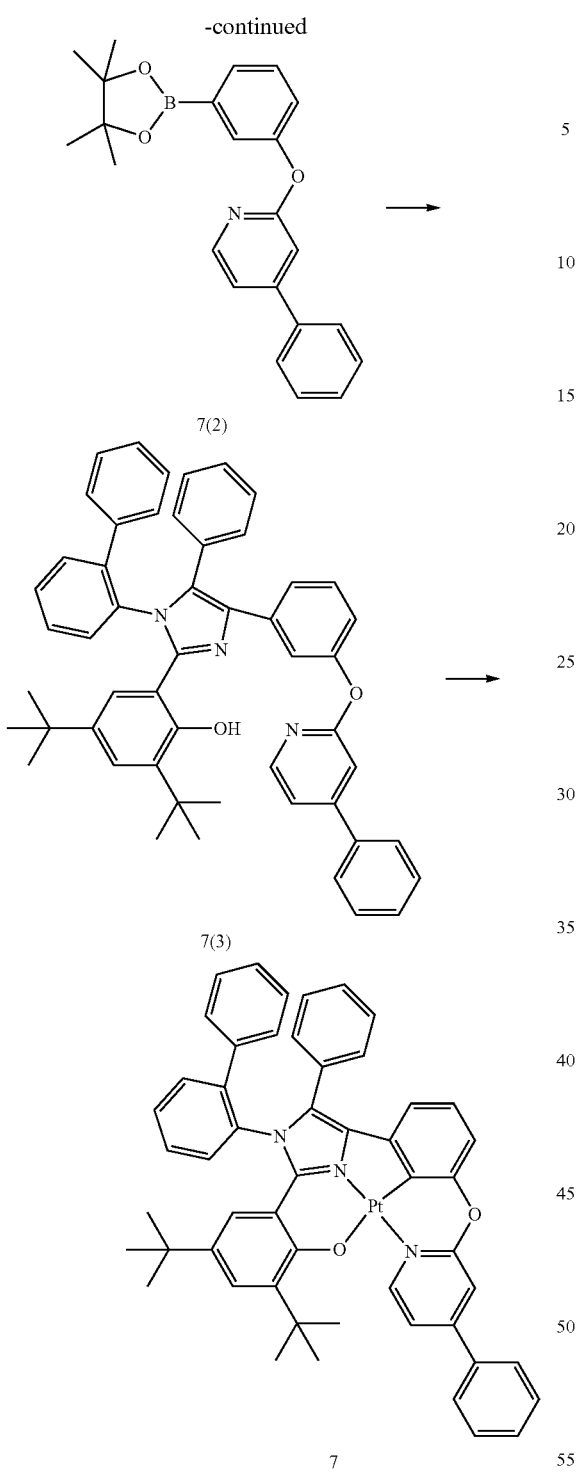

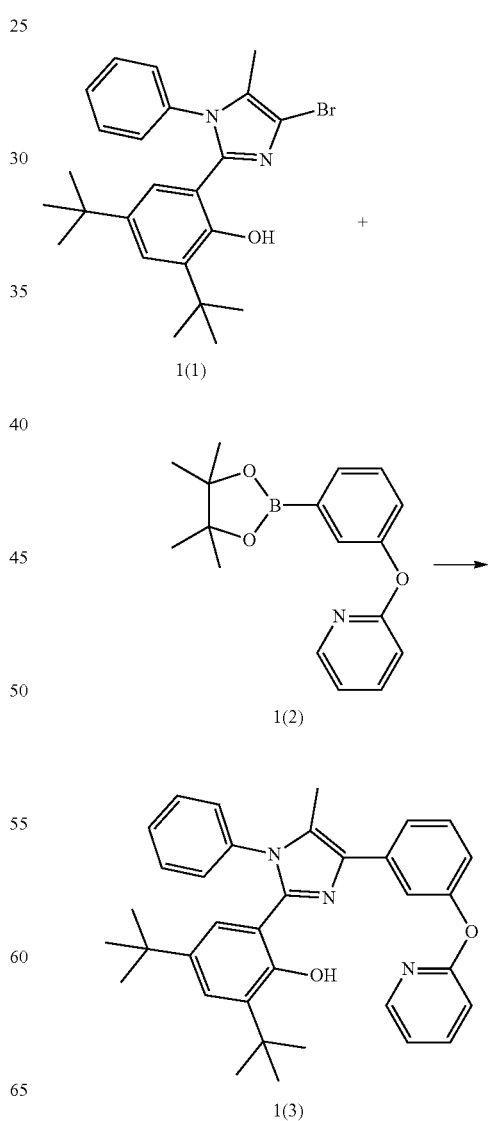

organic layer was concentrated. The crude product was purified by column chromatography (EA/Hex(hexane) with gradient elution from 20% to 35% to complete the production of 2.2 g of Intermediate 7-3 (Yield of 70%). The obtained material was identified by Mass and HPLC.

HRMS(MALDI) calcd for C52H47N3O2: m/z 745.3668, Found: 745.3665.

(2) Synthesis of Compound 7

2.2 g (2.95 mmol) of Intermediate 7(3) and 1.5 g (3.54 mmol, 1.0 eq) of $K_2PtCl_4$ were mixed with 60 mL of AcOH and 20 mL of $H_2O$ and then refluxed for 16 hours. After cooling the reaction mixture to room temperature, the precipitate was filtered and the obtained precipitate was dissolved in methylene chloride (MC) and washed with $H_2O$. The organic layer was concentrated and the crude product was purified by column chromatography (MC 40%, EA 1%, Hex 59%) to obtain 1.7 g of Compound 6 (Yield of 61%). The obtained material was identified by Mass and HPLC.

Synthesis Example 2: Synthesis of Compound 1

(1) Synthesis of Intermediate 7(3)

2.4 g (0.004 mmol, 1.2 eq) of Intermediate 7(1), 1.5 g (0.004 mol, 1 eq) of Intermediate 7(2), 0.34 g (0.001 mmol, 0.07 eq) of tetrakis(triphenylphosphine)palladium (0), and 1.7 g (0.015 mmol, 3 eq) of potassium carbonate were mixed with 80 mL of tetrahydrofuran (THF):distilled water ($H_2O$) at a ratio of 3:1 and refluxed for 12 hours. The reaction mixture was cooled to room temperature, and then, the precipitate was filtered therefrom to obtain a filtrate. The filtrate was washed with ethyl acetate (EA)/$H_2O$ and the

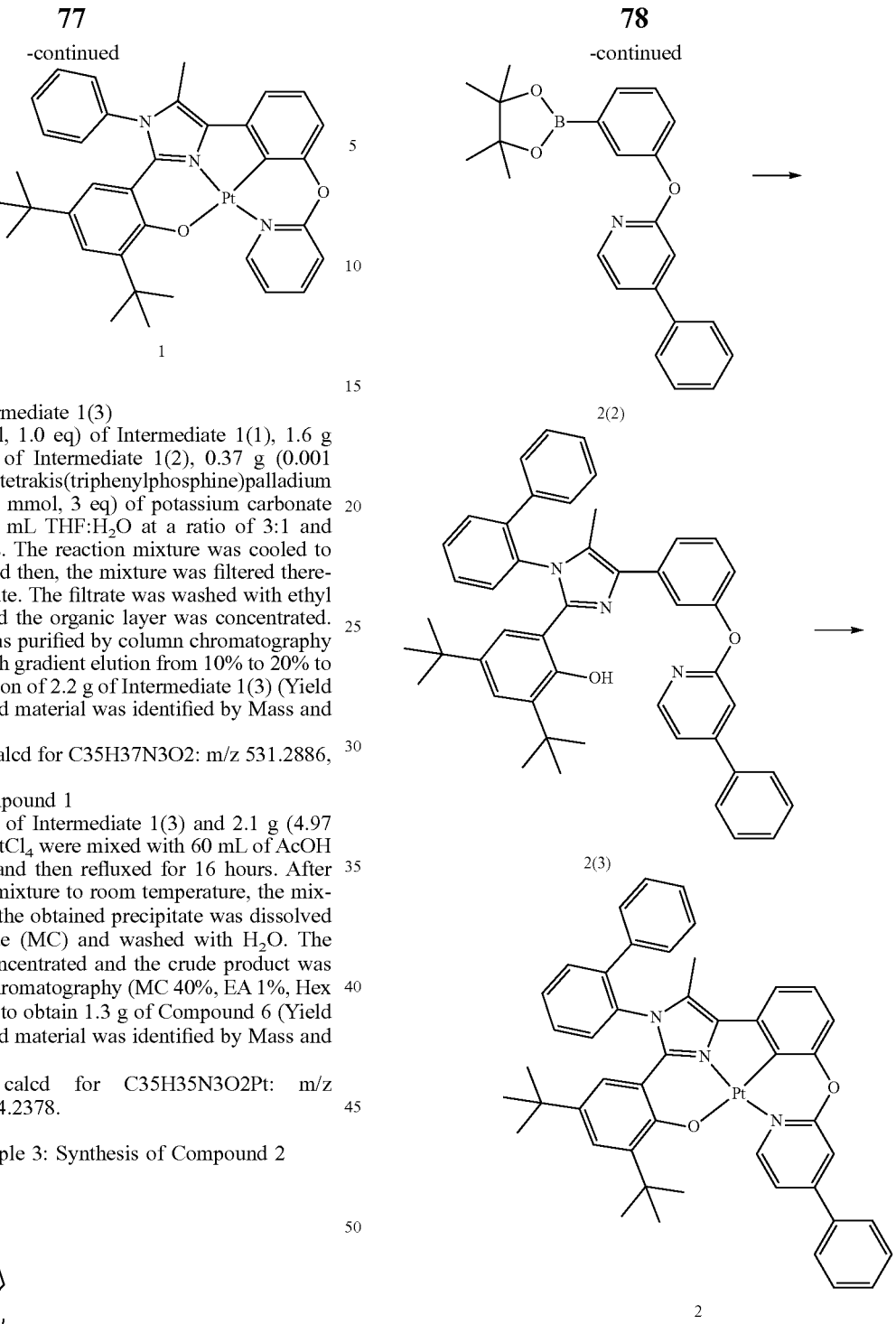

(1) Synthesis of Intermediate 1(3)

2.0 g (0.005 mmol, 1.0 eq) of Intermediate 1(1), 1.6 g (0.005 mol, 1.2 eq) of Intermediate 1(2), 0.37 g (0.001 mmol, 0.07 eq) of tetrakis(triphenylphosphine)palladium (0), and 1.9 g (0.015 mmol, 3 eq) of potassium carbonate were mixed with 50 mL THF:$H_2O$ at a ratio of 3:1 and refluxed for 12 hours. The reaction mixture was cooled to room temperature, and then, the mixture was filtered therefrom to obtain a filtrate. The filtrate was washed with ethyl acetate (EA)/$H_2O$ and the organic layer was concentrated. The crude product was purified by column chromatography (EA/Hex(hexane)) with gradient elution from 10% to 20% to complete the production of 2.2 g of Intermediate 1(3) (Yield of 67%). The obtained material was identified by Mass and HPLC.

HRMS(MALDI) calcd for C35H37N3O2: m/z 531.2886, Found: 531.2884.

(2) Synthesis of Compound 1

2.2 g (4.14 mmol) of Intermediate 1(3) and 2.1 g (4.97 mmol, 1.2 eq) of $K_2PtCl_4$ were mixed with 60 mL of AcOH and 20 mL of $H_2O$ and then refluxed for 16 hours. After cooling the reaction mixture to room temperature, the mixture was filtered and the obtained precipitate was dissolved in methylene chloride (MC) and washed with $H_2O$. The organic layer was concentrated and the crude product was purified by column chromatography (MC 40%, EA 1%, Hex 59%) was performed to obtain 1.3 g of Compound 6 (Yield of 43%). The obtained material was identified by Mass and HPLC.

HRMS(MALDI) calcd for C35H35N3O2Pt: m/z 724.2377, Found: 724.2378.

Synthesis Example 3: Synthesis of Compound 2

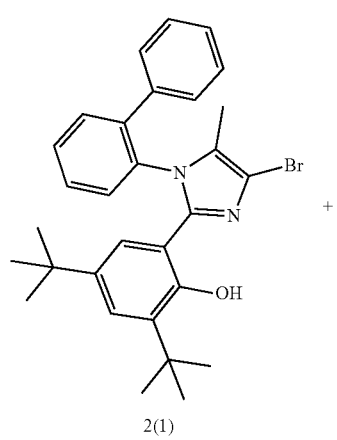

(1) Synthesis of Intermediate 2(3)

2.0 g (0.004 mmol, 1.0 eq) of Intermediate 2(1), 1.7 g (0.004 mol, 1.2 eq) of Intermediate 2(2), 0.31 g (0.001 mmol, 0.07 eq) of tetrakis(triphenylphosphine)palladium (0), and 1.6 g (0.015 mmol, 3 eq) of potassium carbonate were mixed with 80 mL THF:$H_2O$ at a ratio of 3:1 and refluxed for 12 hours. The reaction mixture was cooled to room temperature, and then, the reaction mixture was filtered therefrom to obtain a filtrate. The filtrate was washed with ethyl acetate (EA)/$H_2O$. The organic layer was concentrated and the crude product was purified by column chromatography (EA/Hex(hexane)) with gradient elution from 10% to 30% to complete the production of 1.8 g of Intermediate 2(3) (Yield of 68%). The obtained material was identified by Mass and HPLC.

HRMS(MALDI) calcd for C47H45N3O2: m/z 683.3512, Found: 683.3513.

(2) Synthesis of Compound 2

1.8 g (2.63 mmol) of Intermediate 2(3) and 1.3 g (3.16 mmol, 1.2 eq) of K$_2$PtCl$_4$ were mixed with 80 mL AcOH:H$_2$O (3:1) were mixed and then refluxed for 16 hours. After cooling the reaction mixture to room temperature, the reaction mixture was filtered and the obtained precipitate was dissolved in methylene chloride (MC) and washed with H$_2$O. The organic layer was concentrated and purified by column chromatography (MC 40%, EA 1%, Hex 59%) to obtain 1.1 g of Compound 2 (Yield of 48%). The obtained material was identified by Mass and HPLC.

HRMS(MALDI) calcd for C47H43N3O2Pt: m/z 876.3003, Found: 876.3006.

Synthesis Example 4: Synthesis of Compound 3

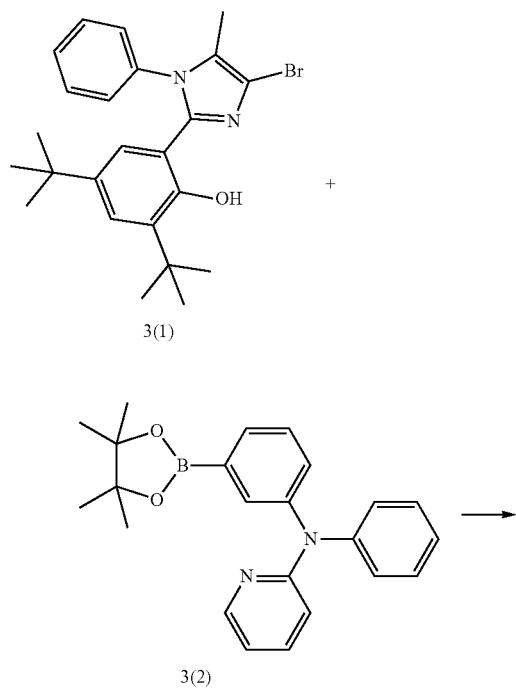

3(1)

3(2)

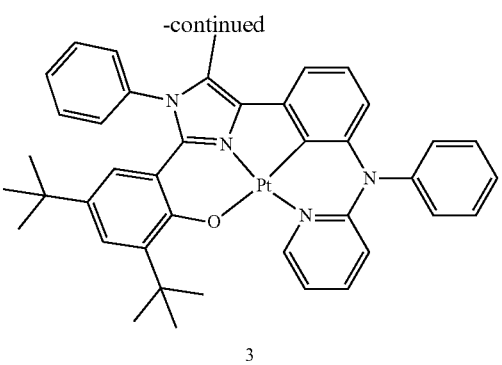

3

(1) Synthesis of Intermediate 3(3)

2.0 g (0.005 mmol, 1.0 eq) of Intermediate 3(1), 2.0 g (0.005 mol, 1.2 eq) of Intermediate 3(2), 0.37 g (0.001 mmol, 0.07 eq) of tetrakis(triphenylphosphine)palladium (0), and 1.9 g (0.014 mmol, 3 eq) of potassium carbonate were mixed with 80 mL THF:H$_2$O at a ratio of 3:1 and refluxed for 12 hours. The reaction mixture was cooled to room temperature, and then, filtered to obtain a filtrate. The filtrate was washed with ethyl acetate (EA)/H$_2$O, and the organic layer was concentrated to provide the crude product. The crude product was purified by column chromatography (EA/Hex(hexane)) with gradient elution from 10% to 30% to complete the production of 2.0 g of Intermediate 3(3) (Yield of 73%). The obtained material was identified by Mass and HPLC.

HRMS(MALDI) calcd for: C41H42N4O m/z 606.3359, Found: 606.3357.

(2) Synthesis of Compound 3

2.0 g (3.30 mmol) of Intermediate 3(3) and 1.6 g (3.96 mmol, 1.2 eq) of K$_2$PtCl$_4$ were mixed with 80 mL AcOH:H$_2$O (3:1) were mixed and then refluxed for 16 hours. After cooling the reaction mixture to room temperature, the reaction mixture was filtered and the obtained precipitate was dissolved in methylene chloride (MC) and washed with H$_2$O. The organic layer was concentrated to provide the crude product, which was purified by column chromatography (MC 40%, EA 1%, Hex 59%) to obtain 1.3 g of Compound 3 (Yield of 49%). The obtained material was identified by Mass and HPLC.

HRMS(MALDI) calcd for: C41H40N4OPt m/z 799.2850, Found: 799.2852.

Synthesis Example 5: Synthesis of Compound 4

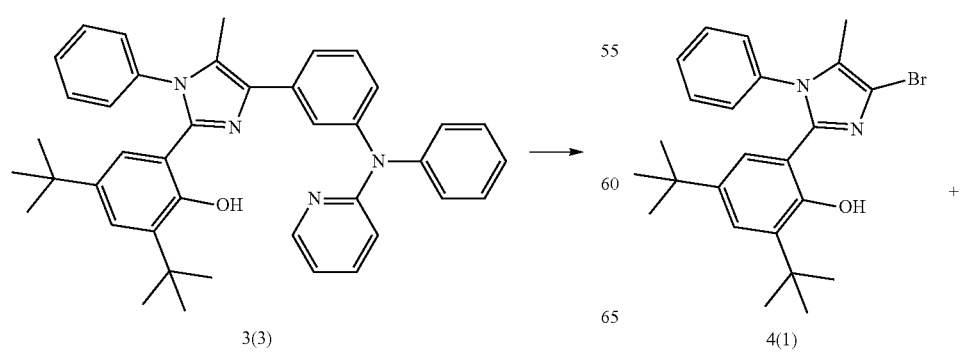

3(3)

4(1)

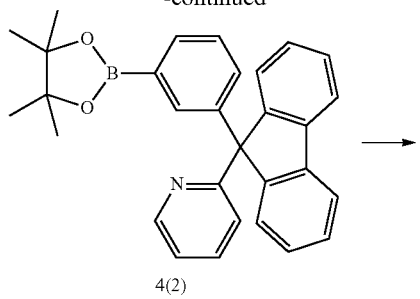

4(2)

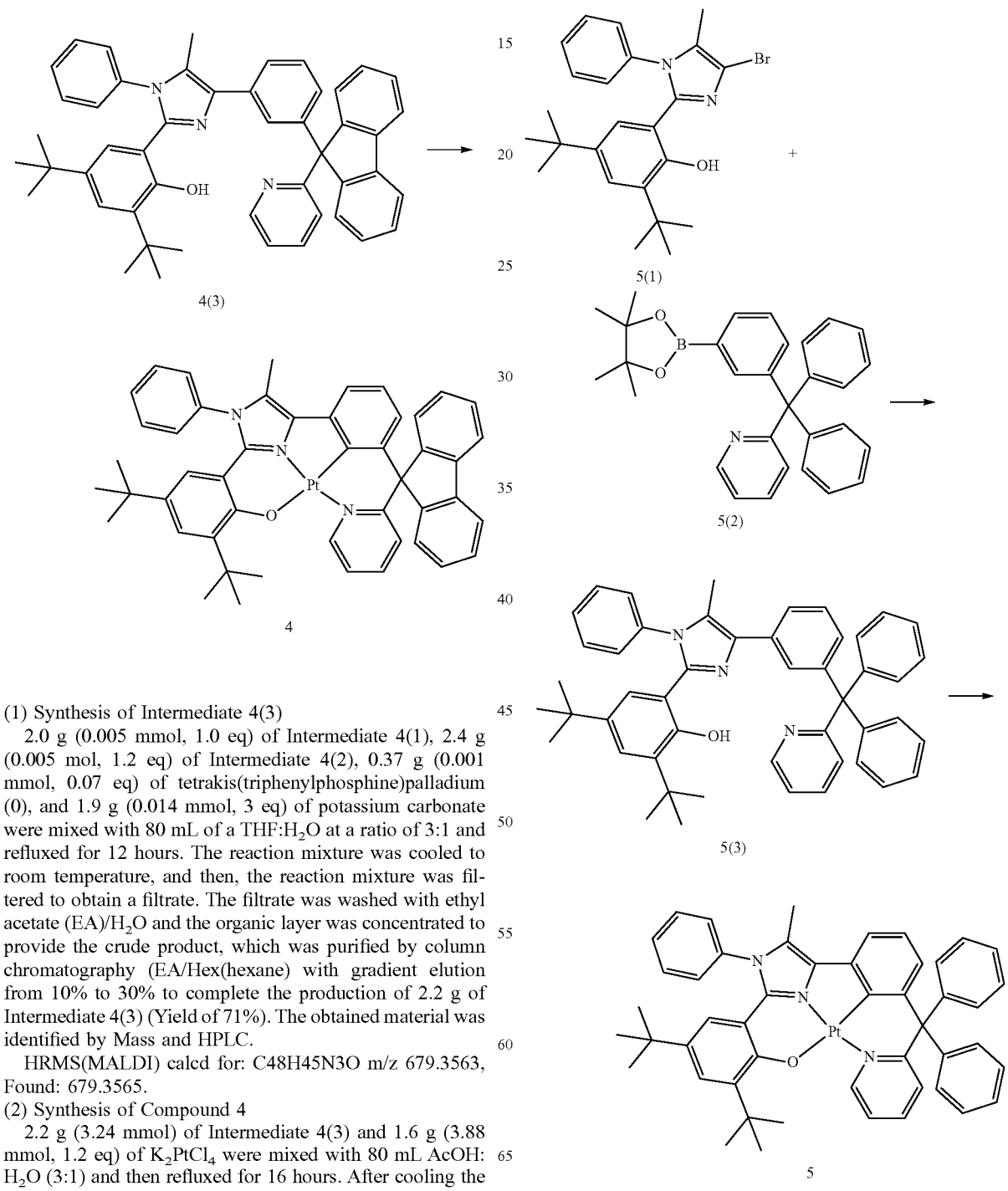

(1) Synthesis of Intermediate 4(3)

2.0 g (0.005 mmol, 1.0 eq) of Intermediate 4(1), 2.4 g (0.005 mol, 1.2 eq) of Intermediate 4(2), 0.37 g (0.001 mmol, 0.07 eq) of tetrakis(triphenylphosphine)palladium (0), and 1.9 g (0.014 mmol, 3 eq) of potassium carbonate were mixed with 80 mL of a THF:H$_2$O at a ratio of 3:1 and refluxed for 12 hours. The reaction mixture was cooled to room temperature, and then, the reaction mixture was filtered to obtain a filtrate. The filtrate was washed with ethyl acetate (EA)/H$_2$O and the organic layer was concentrated to provide the crude product, which was purified by column chromatography (EA/Hex(hexane)) with gradient elution from 10% to 30% to complete the production of 2.2 g of Intermediate 4(3) (Yield of 71%). The obtained material was identified by Mass and HPLC.

HRMS(MALDI) calcd for: C48H45N3O m/z 679.3563, Found: 679.3565.

(2) Synthesis of Compound 4

2.2 g (3.24 mmol) of Intermediate 4(3) and 1.6 g (3.88 mmol, 1.2 eq) of K$_2$PtCl$_4$ were mixed with 80 mL AcOH: H$_2$O (3:1) and then refluxed for 16 hours. After cooling the reaction mixture to room temperature, the reaction mixture was filtered and the obtained precipitate was dissolved in methylene chloride (MC) and washed with H$_2$O. The organic layer was concentrated and the resulting crude product was purified by column chromatography (MC 40%, EA 1%, Hex 59%) to obtain 0.8 g of Compound 4 (Yield of 28%). The obtained material was identified by Mass and HPLC.

HRMS(MALDI) calcd for: C48H43N3OPt m/z 872.3054, Found: 872.3056.

Synthesis Example 5: Synthesis of Compound 5

(1) Synthesis of Intermediate 5(3)

2.0 g (0.005 mmol, 1.0 eq) of Intermediate 4(1), 2.4 g (0.005 mol, 1.2 eq) of Intermediate 4(2), 0.37 g (0.001 mmol, 0.07 eq) of tetrakis(triphenylphosphine)palladium (0), and 1.9 g (0.014 mmol, 3 eq) of potassium carbonate were mixed with 80 mL THF:$H_2O$ at a ratio of 3:1 and refluxed for 12 hours. The reaction mixture was cooled to room temperature, and then, the reaction mixture was filtered to obtain a filtrate. The filtrate was washed with ethyl acetate (EA)/$H_2O$, the organic layer was concentrated, and the resulting crude product was purified by column chromatography (EA/Hex(hexane)) with gradient elution from 10% to 30% to complete the production of 2.1 g of Intermediate 5(3) (Yield of 68%). The obtained material was identified by Mass and HPLC.

HRMS(MALDI) calcd for: C48H47N3O m/z 681.3719, Found: 681.3718.

(2) Synthesis of Compound 5

2.1 g (3.08 mmol) of Intermediate 5(3) and 1.53 g (3.70 mmol, 1.2 eq) of $K_2PtCl_4$ were mixed with 80 mL AcOH:$H_2O$ (3:1) were mixed and then refluxed for 16 hours. After cooling the reaction mixture to room temperature, the reaction mixture was filtered and the obtained precipitate was dissolved in methylene chloride (MC) and washed with $H_2O$. The organic layers was concentrated and the resulting crude product was purified by column chromatography (MC 40%, EA 1%, Hex 59%) to obtain 0.5 g of Compound 5 (Yield of 19%). The obtained material was identified by Mass and HPLC.

HRMS(MALDI) calcd for: C48H45N3OPt m/z 874.3210, Found: 874.3211.

Example 1

As an anode, an ITO-patterned glass substrate was cut to a size of 50 mm×50 mm×0.5 mm, sonicated with isopropyl alcohol and pure water, each for 5 minutes, and then cleaned by exposure to ultraviolet rays and ozone for 30 minutes. Then, the ITO-patterned glass substrate was provided to a vacuum deposition apparatus.

HT3 and F6TCNNQ were vacuum-deposited at the weight ratio of 98:2 on the anode to form a hole injection layer having a thickness of 100 Å, and HT3 was vacuum-deposited on the hole injection layer to form a hole transport layer having a thickness of 1350 Å. H-H1 was deposited on the hole transport layer to form a hole transport layer having a thickness of 300 Å.

Then, H-H1, H-H2, and Compound 1(dopant) were co-deposited at the weight ratio of 47.5:47.5:5 on the hole transport layer to form an emission layer having a thickness of 400 Å.

Then, ET3 and ET-D1 were co-deposited at the volume ratio of 50:50 on the emission layer to form an electron transport layer having a thickness of 350 Å, and ET-D1 was vacuum-deposited on the electron transport layer to form an electron injection layer having a thickness of 10 Å, and Al was vacuum-deposited on the electron injection layer to form a cathode having a thickness of 1000 Å, thereby completing the manufacture of an organic light-emitting device.

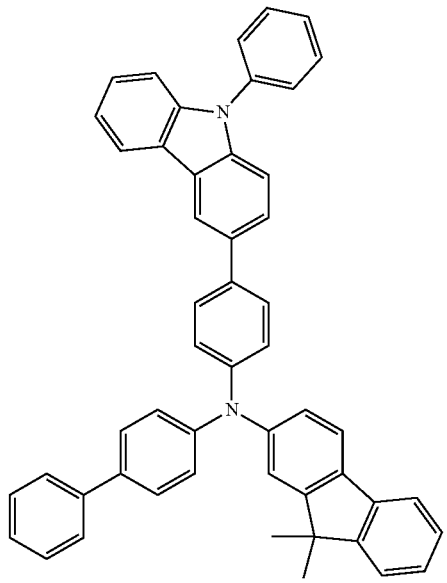

HT3

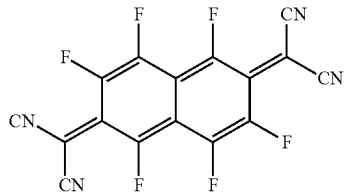

F6-TCNNQ

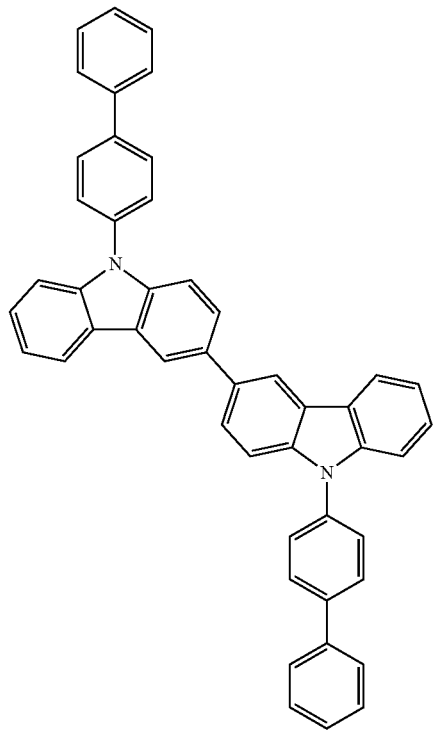

H-H1

-continued

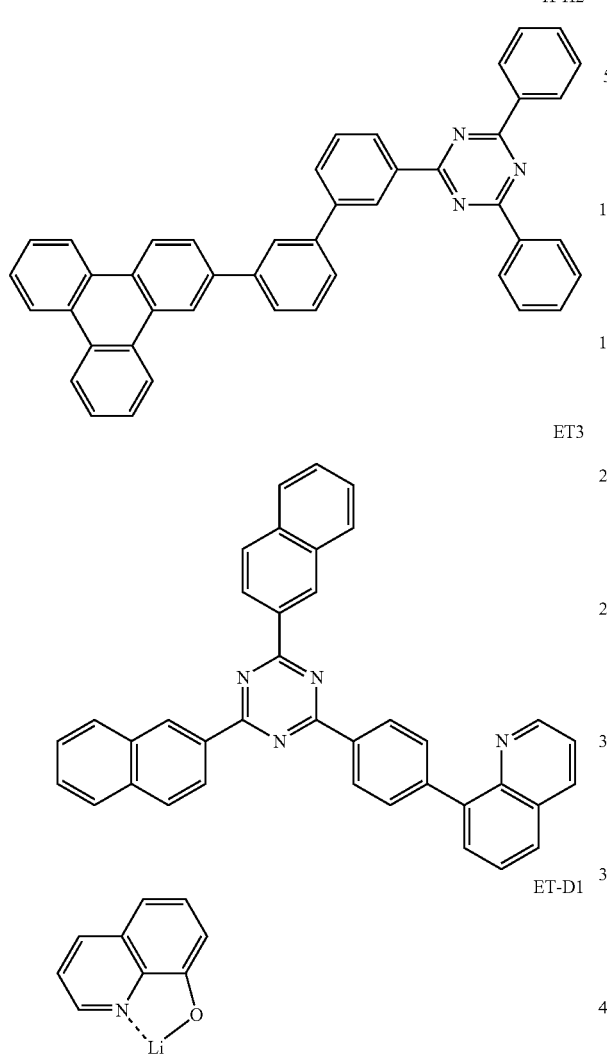

Examples 2 to 6 and Comparative Examples 1 and 2

Organic light-emitting devices were manufactured in the same manner as in Example 1, except that Compounds shown in Table 2 were each used instead of Compound 1 as a dopant in forming an emission layer.

Evaluation Example 1: Evaluation of Characteristics of Organic Light-Emitting Devices The driving voltage, the luminescence quantum efficiency, and the lifespan ($T_{95}$) of each of the organic light-emitting devices manufactured according to Examples 1 to 6 and Comparative Examples 1 and 2 were evaluated. Results thereof are shown in Table 2. This evaluation was performed using a current-voltage meter (Keithley 2400) and a luminescence meter (Minolta Cs-1,000A), and the lifespan ($T_{95}$)(at 6000 nit) was evaluated by measuring, as a relative value (%), the amount of time that elapsed until luminance was reduced to 95% of the initial brightness of 100%.

TABLE 2

| No. | Dopant Compound No. | Driving voltage (Relative value, %) | Luminescence quantum efficiency (Relative value, %) | lifespan ($T_{95}$) (Relative value, %) |
|---|---|---|---|---|
| Example 1 | 1 | 76% | 78% | 40% |
| Example 2 | 2 | 77% | 95% | 57% |
| Example 3 | 3 | 80% | 73% | 50% |
| Example 4 | 4 | 79% | 69% | 28% |
| Example 5 | 5 | 79% | 67% | 35% |
| Example 6 | 7 | 77% | 100% | 50% |
| Comparative Example 1 | B | 93% | 40% | 8% |
| Comparative Example 2 | C | 100% | 27% | 1% |

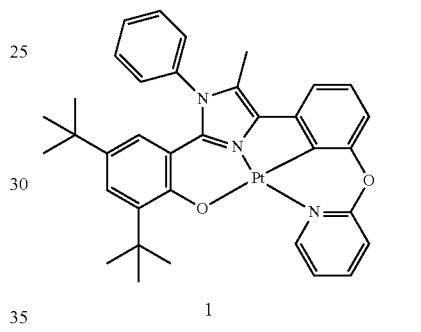

1

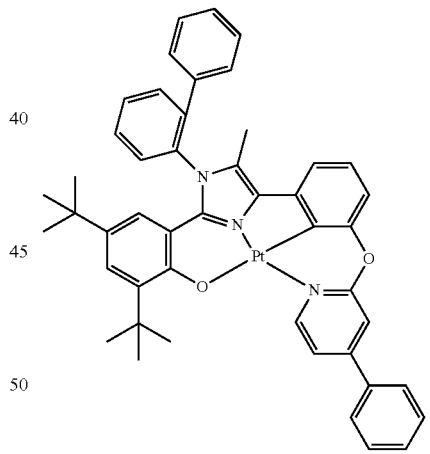

2

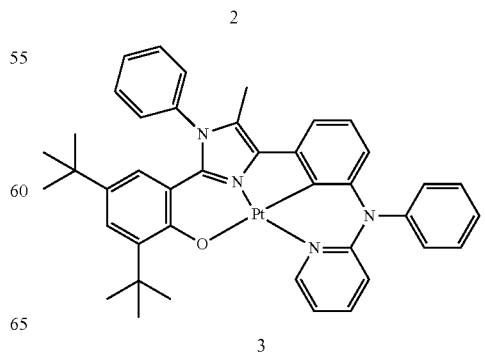

3

TABLE 2-continued

| No. | Dopant Compound No. | Driving voltage (Relative value, %) | Luminescence quantum efficiency (Relative value, %) | lifespan (T95) (Relative value, %) |
|---|---|---|---|---|
| | 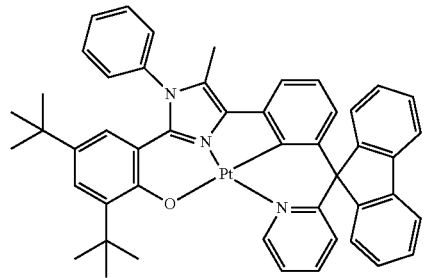 4 | | | |
| | 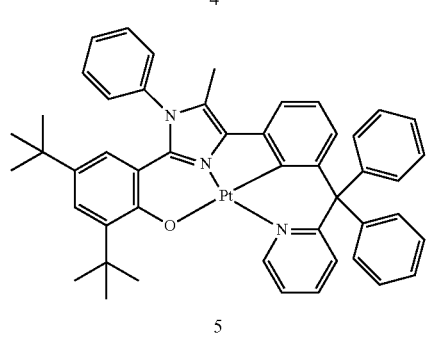 5 | | | |
| | 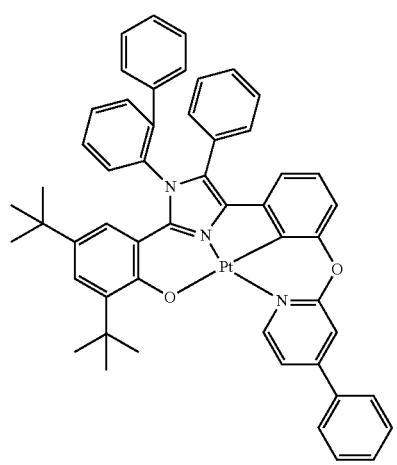 7 | | | |
| | 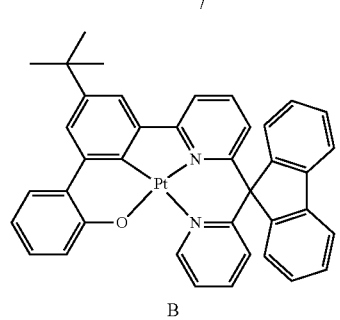 B | | | |
| | 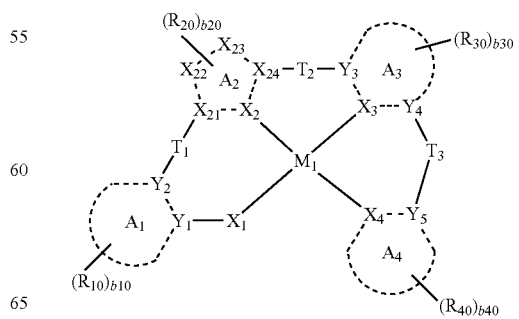 C | | | |

From Table 2, it was confirmed that the organic light-emitting devices of Example 1 to 6 have a lower driving voltage, higher luminescence quantum efficiency, and a longer lifespan, than the organic light-emitting devices of Comparative Examples 1 and 2.

The organometallic compounds have excellent electrical characteristics and/or thermal stability. Accordingly, an organic light-emitting device using the organometallic compounds has low driving voltage and excellent luminescence quantum efficiency and lifespan characteristics. Such organometallic compounds have excellent phosphorescent luminescent characteristics, and thus, when used, a diagnostic composition having a high diagnostic efficiency may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organometallic compound represented by Formula 1:

Formula 1 wherein, in Formula 1, $M_1$ is beryllium (Be), magnesium (Mg), aluminum (A), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), ring $A_1$ and ring $A_3$ are each independently a $C_5$-$C_{30}$ carbocyclic group or a $C_2$-$C_{60}$ heterocyclic group, ring $A_4$ is a $C_2$-$C_{60}$ heterocyclic group, wherein a moiety represented by

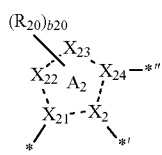

in Formula 1 is a group represented by one of Formulae CY2-1 to CY2-8:

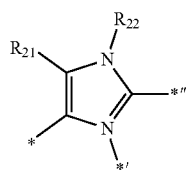
CY2-1

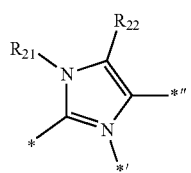
CY2-2

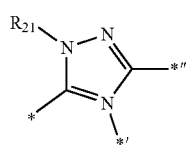
CY2-3

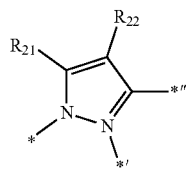
CY2-4

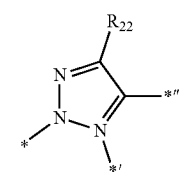
CY2-5

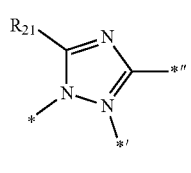
CY2-6

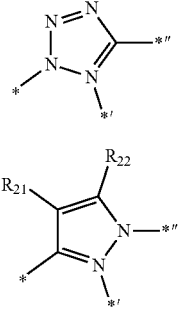
CY2-7

CY2-8 wherein, in Formulae CY2-1 to CY2-8,

*, *', and *'' are each independently a binding site to a neighboring atom, $X_1$ is N, O, or S, $X_3$ is C, and $X_4$ is N, a bond between $X_1$ and $M_1$, a bond between $X_1$ and $M_1$, a bond between $X_3$ and $M_1$, and a bond between $X_4$ and $M_1$ are each independently a covalent bond or a coordination bond, $Y_1$ to $Y_5$ are each C, $T_1$ and $T_2$ are each independently a single bond, *—N $[L_1)_{a1}$-$(R_1)_{b1}]$—*', *—B($R_1$)—*', *—P($R_1$)—*', *—C ($R_1$)($R_2$)—*', *—Si($R_1$)($R_2$)—*', *—Ge($R_1$)($R_2$)—*', *—S—*', *—Se—*', *—O—*', *—C(=O)—*', *—S (=O)—*', *—S(=O)$_2$—*', *—C($R_1$)=*', *=C ($R_1$)—*', *—C($R_1$)=C($R_2$)—*', *—C(=S)—*', or *—C≡C—*', $T_3$ is *—N[$L_1)_{a1}$-($R_1)_{b1}$]—*', *—B($R_1$)—*', *—P($R_1$)—*', *—C($R_1$)($R_2$)—*', *—Si($R_1$)($R_2$)—*', *—Ge($R_1$) ($R_2$)—*', *—S—*', *—Se—*', *—O—*', *—C (=O)—*', *—S(=O)—*', *—S(=O)$_2$—*', *—C($R_1$) =*', *=C($R_1$)—*', *—C($R_1$)=C($R_2$)—*', *—C (=S)—*', or *—C≡C—*', $L_1$ is a single bond, a substituted or unsubstituted $C_5$-$C_{30}$ carbocyclic group, or a substituted or unsubstituted $C_1$-$C_{30}$ heterocyclic group, a1 is an integer from 1 to 3, wherein when a1 is 2 or more, two or more $L_1$ (s) are identical to or different from each other, b1 is an integer from 1 to 5, wherein when b1 is 2 or more, two or more $R_1$ (s) are identical to or different from each other, $R_1$ and $R_2$ are optionally linked to each other via a single bond, a double bond, or a first linking group to form a substituted or unsubstituted $C_5$-$C_{30}$ carbocyclic group or a substituted or unsubstituted $C_1$-$C_{30}$ heterocyclic group, $R_1$, $R_2$, $R_{30}$, and $R_{40}$ are each independently hydrogen, deuterium, —F, —Cl, —Br, —I, —SF$_5$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($O_5$), —B($Q_6$)($Q_7$), or —P(=O)($Q_8$)($Q_9$), $R_{21}$ and $R_{22}$ are each independently deuterium, —F, —Cl, —Br, —I, —SF$_5$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($O_5$), —B($Q_6$)($Q_7$), or —P(=O)($Q_8$)($Q_9$), provided that when a moiety represented by

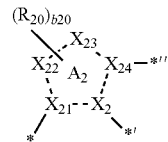

in Formula 1 is a group represented by Formula CY2-2, then $R_{21}$ and $R_{22}$ are different, b10 is an integer from 2 to 10, Each $R_{10}$ is independently deuterium, —F, —Cl, —Br, —I, —SF$_5$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($O_5$), —B($Q_6$)($Q_7$), or —P(=O)($Q_8$)($Q_9$), b30, and b40 are each independently an integer from 1 to 10, $R_{21}$ and $R_{22}$ are optionally linked together to form a $C_5$-$C_{30}$ carbocyclic that is unsubstituted or substituted with at least one $R_{10a}$ or a $C_1$-$C_{30}$ heterocyclic group that is unsubstituted or substituted with at least one $R_{10a}$, provided that wherein a moiety represented by

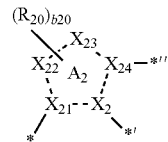

in Formula 1 is a group represented by one of Formulae CY2-4 and CY2-8, then $R_{21}$ and $R_{22}$ are not optionally linked to form a $C_6$-carbocyclic group, i) $R_{30}$ and at least one of $R_1$ and $R_2$ are optionally linked together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, ii) $R_{40}$ and at least one of $R_1$ and $R_2$ are optionally linked together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is the same as explained in connection with $R_{10}$, and at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —$C_1$, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), —P(=O)($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(=O)($Q_{28}$)($Q_{29}$), or any combination thereof; or —N($Q_{31}$)($Q_{32}$), —Si($Q_{33}$)($Q_{34}$)($Q_{35}$), —B($Q_{36}$)($Q_{37}$), or —P(=O)($Q_{38}$)($Q_{39}$), wherein $Q_1$ to $Q_9$, $Q_{11}$ to $Q_{19}$, $Q_{21}$ to $Q_{29}$ and $Q_{31}$ to $Q_{39}$ are each independently hydrogen, deuterium, —F, —Cl, —Br, —I, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryl group substituted with at least one a $C_1$-$C_{60}$ alkyl group, or any combination thereof, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

2. The organometallic compound of claim 1, wherein ring $A_4$ is an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, aquinazoline group, a phenanthroline group, a pyrrole group, a pyrazole group, an imidazole group, a triazole group, a tetrazole group, an oxazole group, an isooxazole group, a thiazole group, an isothiazole group, an oxadiazole group, a thiadiazole group, a benzopyrazole group, a benzimidazole group, an indazole group, a benzoxazole group, a benzothiazole group, a benzoxadiazole group, a benzothiadiazole group, a benzotriazole group, a diazaindene group, a triazaindene group, a 5,6,7,8-tetrahydroisoquinoline group, or a 5,6,7,8-tetrahydroquinoline group.

3. The organometallic compound of claim 1, wherein a moiety represented by

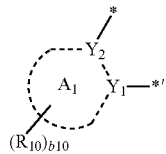

in Formula 1 is a group represented by one of Formulae CY1-1 to CY1-4 and CY1-11 to CY1-16:

CY1-1

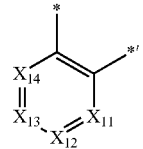

CY1-2

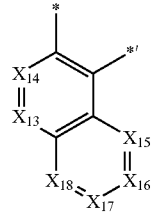

CY1-3

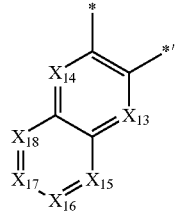

CY1-4

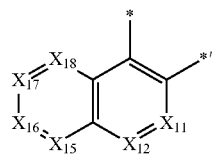

CY1-11

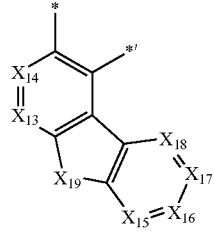

-continued

CY1-12
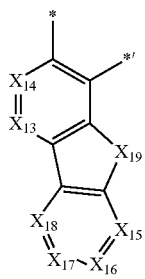

CY1-13
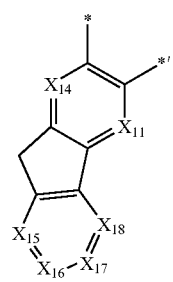

CY1-14
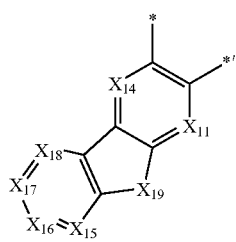

CY1-15
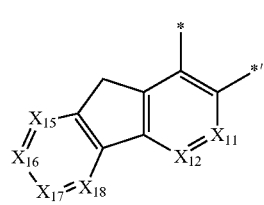

CY1-16
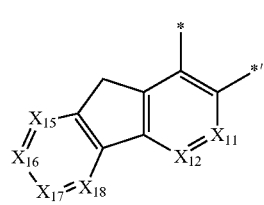

wherein, in Formulae CY1-1 to CY1-16, $X_{11}$ is N or $C(R_{11})$, $X_{12}$ is N or $C(R_{12})$, $X_{13}$ is N or $C(R_{13})$, $X_{14}$ is N or $C(R_{14})$, $X_{15}$ is N or $C(R_{15})$, $X_{16}$ is N or $C(R_{16})$, $X_{17}$ is N or $C(R_{17})$, and $X_{18}$ is N or $C(R_{18})$, $X_{19}$ is $C(R_{19a})(R_{19b})$, $N(R_{19})$, O, S, or $Si(R_{19a})(R_{19b})$, $R_{11}$ to $R_{19}$, $R_{19a}$, and $R_{19b}$ are each independently the same as described in connection with $R_{10}$ in claim 1, and

* and *' each indicate a binding site to a neighboring atom.

4. The organometallic compound of claim 1, wherein a moiety represented by

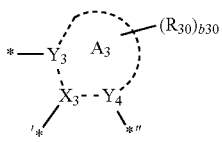

in Formula 1 is a group represented by one of Formulae CY3-1 to CY3-11:

CY3-1
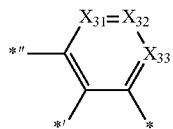

CY3-2
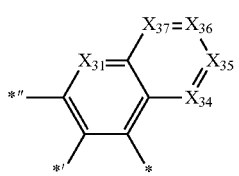

CY3-3
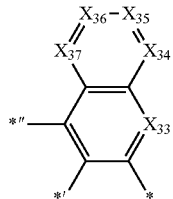

CY3-4
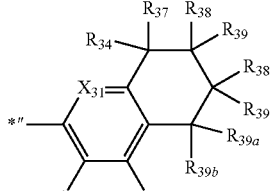

CY3-5
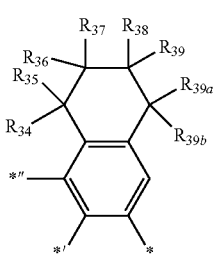

CY3-6
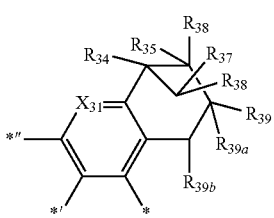

-continued

CY3-7
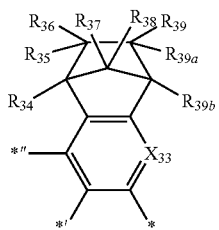

CY3-8
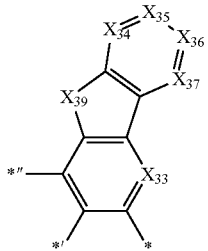

CY3-9
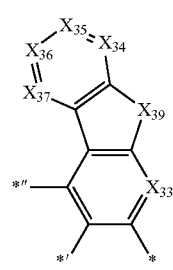

CY3-10
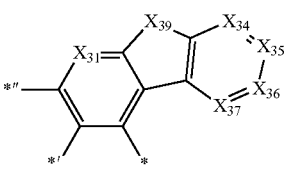

CY3-11
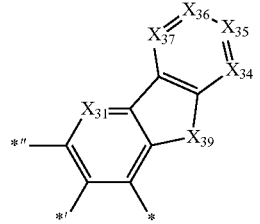

wherein, in Formulae CY3-1 to CY3-11, $X_{31}$ is N or $C(R_{31})$, $X_{32}$ is N or $C(R_{32})$, $X_{33}$ is N or $C(R_{33})$, $X_{34}$ is N or $C(R_{34})$, $X_{35}$ is N or $C(R_{35})$, $X_{36}$ is N or $C(R_{36})$, and $X_{37}$ is N or $C(R_{37})$, $X_{39}$ is $C(R_{39a})(R_{39b})$, $N(R_{39})$, O, S, or $Si(R_{39a})(R_{39b})$, $R_{31}$ to $R_{39}$, $R_{39a}$, and $R_{39b}$ are each independently the same as described in connection with $R_{30}$ in claim 1, and

*, *', and *" are each independently a binding site to a neighboring atom.

5. The organometallic compound of claim 1, wherein a moiety represented by

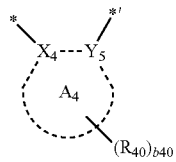

in Formula 1 is a group represented by one of Formulae CY4-1 to CY4-4:

CY4-1

CY4-2

CY4-3

CY4-4
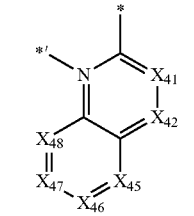

wherein, in Formulae CY4-1 to CY4-84, $X_{41}$ is N or $C(R_{41})$, $X_{42}$ is N or $C(R_{42})$, $X_{43}$ is N or $C(R_{43})$, $X_{44}$ is N or $C(R_{44})$, $X_{45}$ is N or $C(R_{45})$, $X_{46}$ is N or $C(R_{46})$, $X_{47}$ is N or $C(R_{47})$, and $X_{48}$ is N or $C(R_{48})$, $R_{41}$ to $R_{48}$ are each independently the same as described in connection with $R_{40}$ in claim 1, and

* and *' each indicate a binding site to a neighboring atom.

6. The organometallic compound of claim 1, wherein $T_3$ is *—$N[(L_1)_{a1}$-$(R_1)_{b1}]$—*', *—$C(R_1)(R_2)$—*', *—$Si(R_1)(R_2)$—*', *—O—*', or *—S—*', $L_1$ is:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with at least one deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof, $R_1$ and $R_2$ are each independently:

a $C_1$-$C_{30}$ alkyl group;

a $C_1$-$C_{30}$ alkyl group, substituted with at least one deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, or an imidazopyrimidinyl group; or a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with at least one deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, or any combination thereof.

7. The organometallic compound of claim 1, wherein $R_1$, $R_2$, $R_{30}$, and $R_{40}$ are each independently hydrogen, deuterium, —F, a cyano group, a nitro group, —SF$_5$, —CH$_3$, —CD$_3$, —CD$_2$H, —CDH$_2$, —CF$_3$, —CF$_2$H, —CFH$_2$, a group represented by one of Formulae 9-1 to 9-19, a group represented by one of Formulae 10-1 to 10-46, or —Si(Q$_3$)(Q$_4$)(Q$_5$):

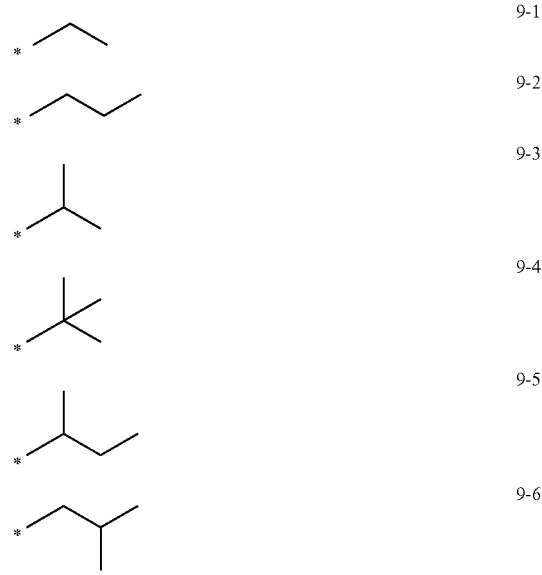

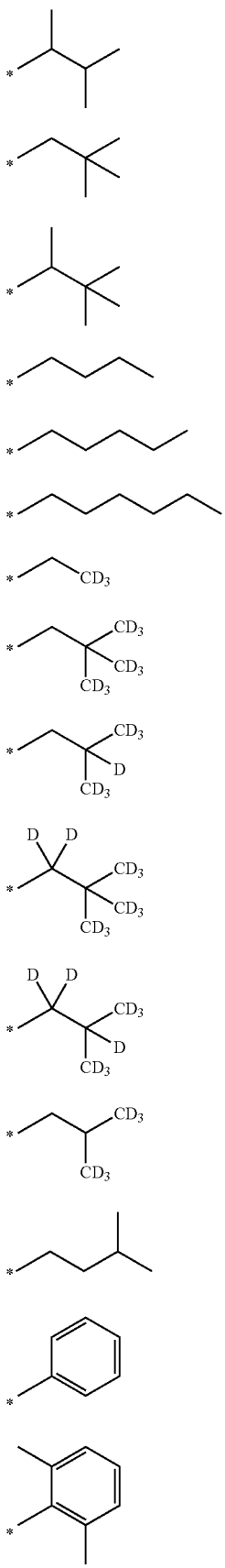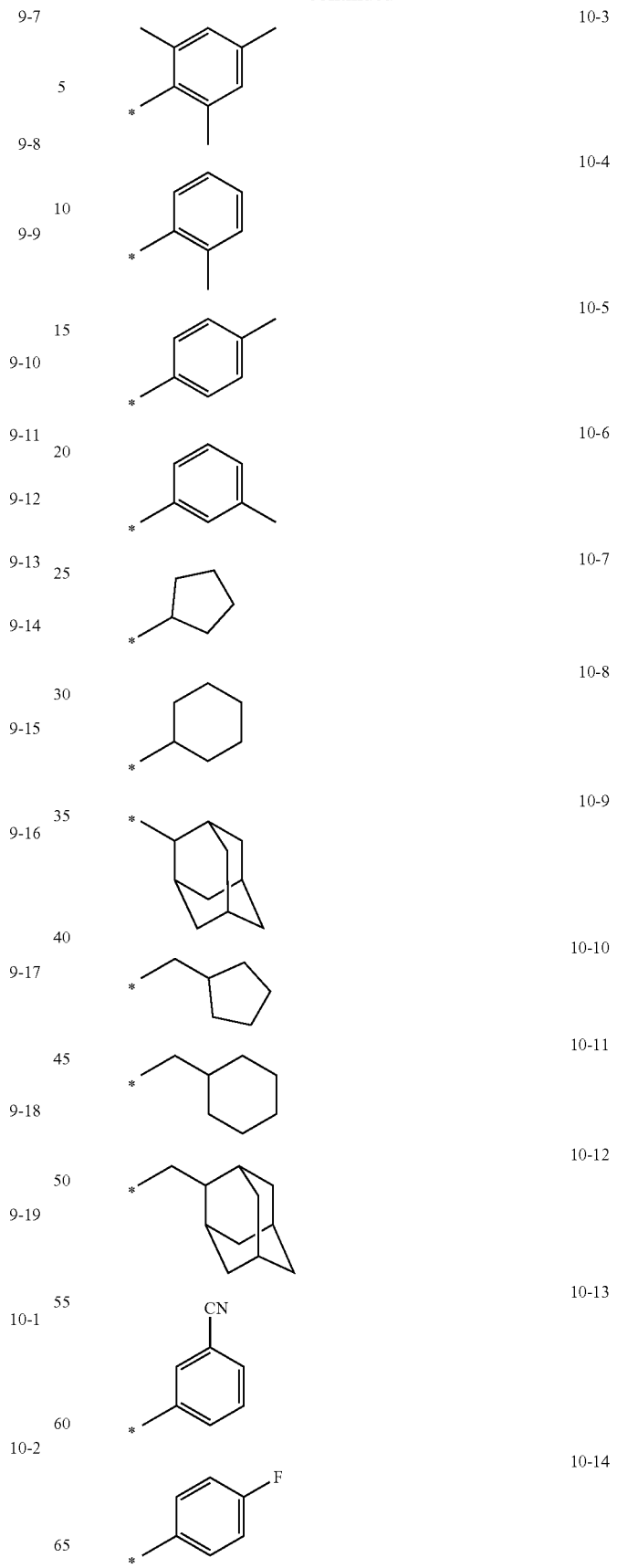

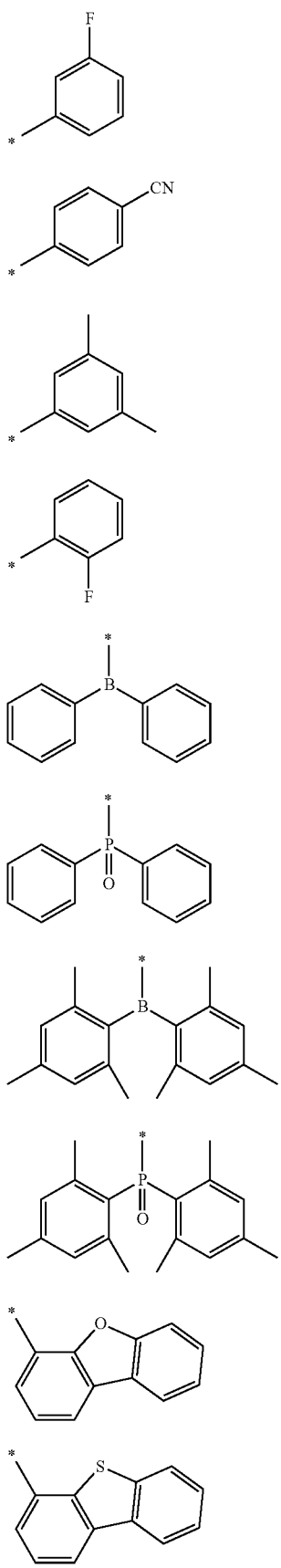
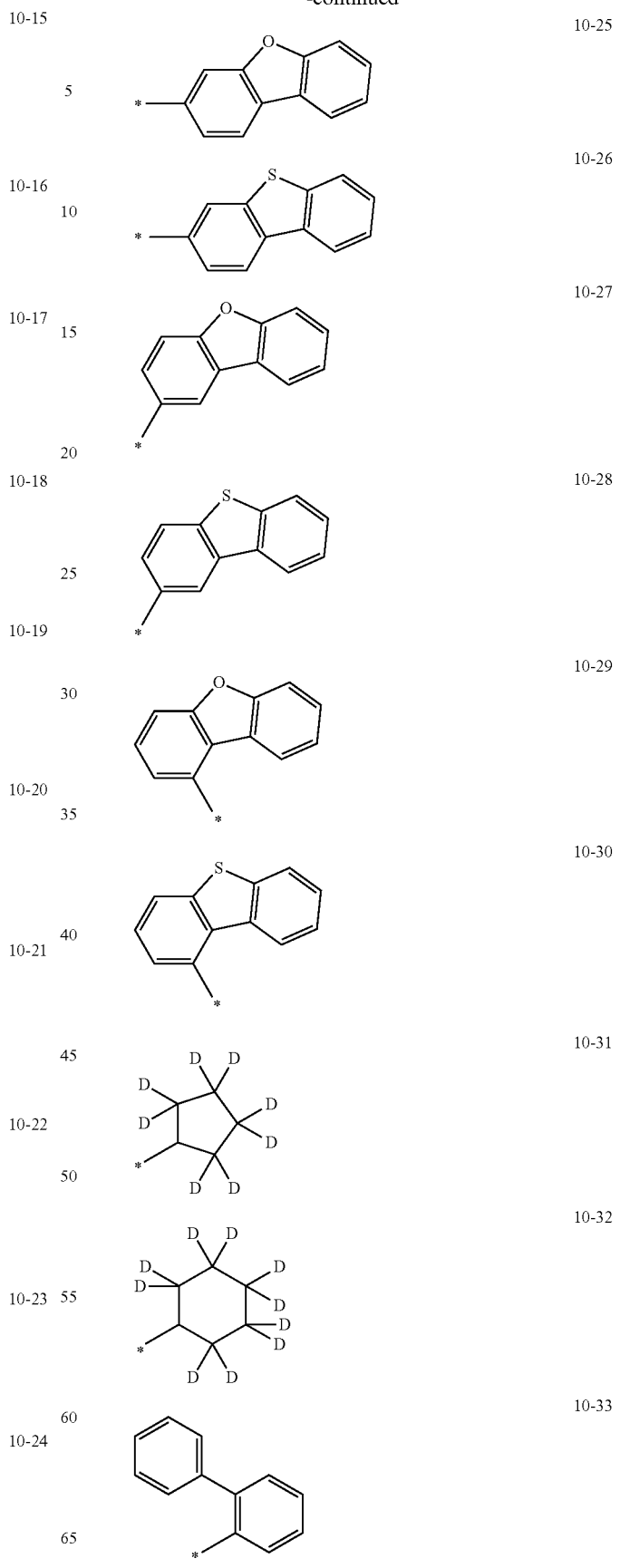

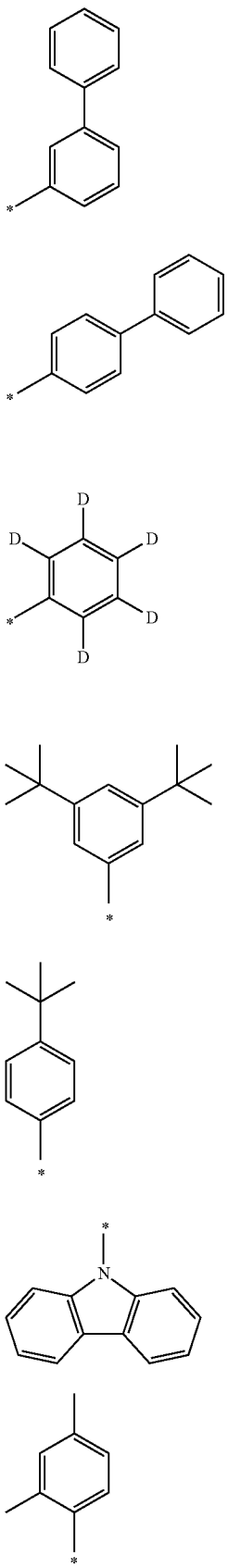
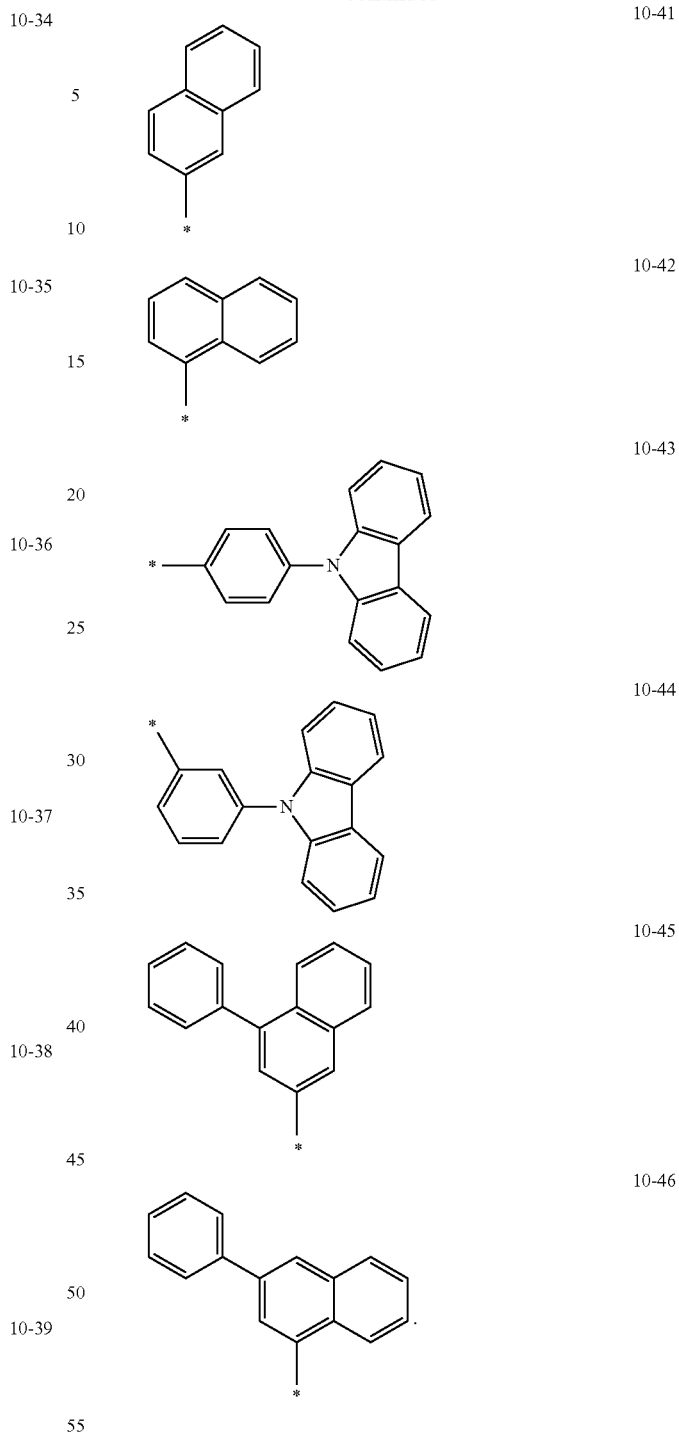
and
\* in Formulae 9-1 to 9-19 and 10-1 to 10-46 indicates a binding site to a neighboring atom.
8. The organometallic compound of claim 7, wherein at least one $R_{10}$ is of Formulae 9-1 to 9-19.
9. The organometallic compound of claim 7, wherein at least one $R_{21}$ to $R_{22}$ is of Formulae 10-1 to 10-46.
10. The organometallic compound of claim 1, wherein ring $A_1$ and ring $A_3$ are each a benzene group and ring $A_4$ is a pyridine group, a bond between $X_2$ and $M_1$ and a bond between $X_4$ and $M_1$ are each a coordination bond, and a bond between $X_3$ and $M_1$ is a covalent bond, $Y_1$ to $Y_5$ are each C, at least one of $R_1$, $R_2$, $R_{10}$, $R_{21}$ to $R_{22}$, $R_{30}$, and $R_{40}$ is:

a $C_1$-$C_{30}$ alkyl group;

a $C_1$-$C_{30}$ alkyl group substituted with at least one deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group; and a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group.

11. The organometallic compound of claim 1, wherein the organometallic compound is of Compounds 1 to 5, 7 to 9, and 12:

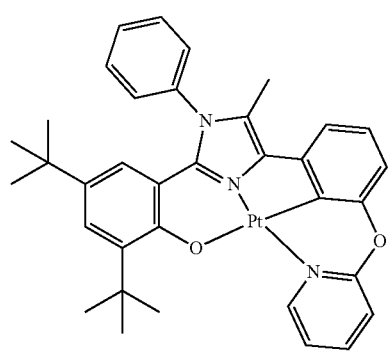

1

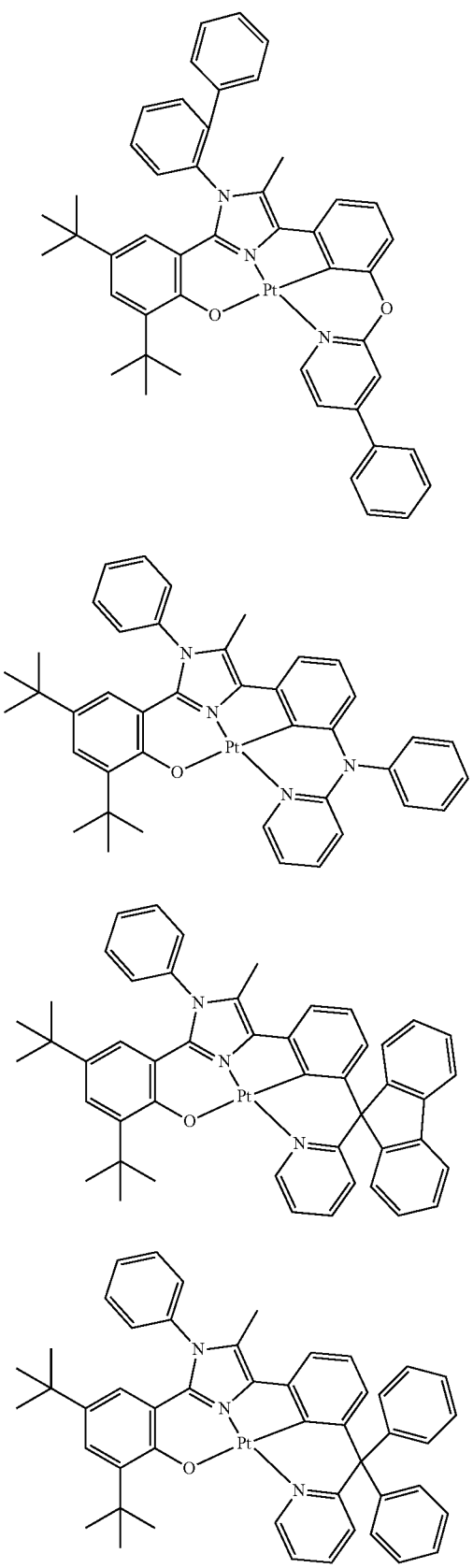
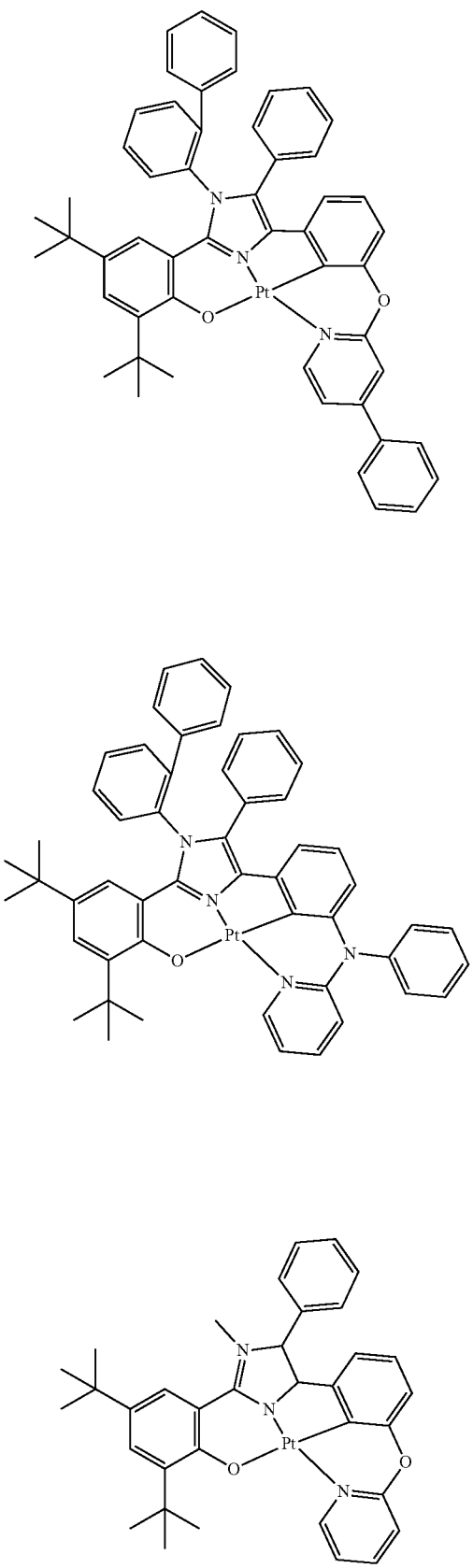

-continued

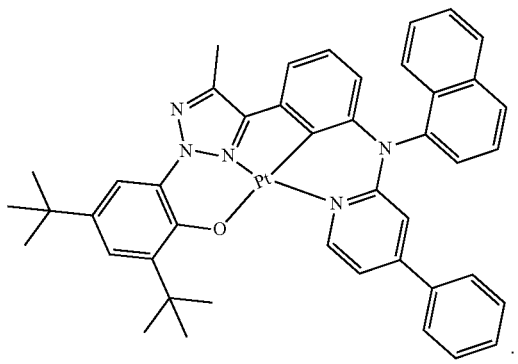

12. An organic light-emitting device comprising:
a first electrode;
a second electrode; and
an organic layer including an emission layer between the first electrode and the second electrode,
wherein the organic layer comprises at least one organometallic compound of claim 1.

13. The organic light-emitting device of claim 12, wherein
the first electrode is an anode,
the second electrode is a cathode,
the organic layer further comprises a hole transport region between the first electrode and the emission layer and an electron transport region between the emission layer and the second electrode,
the hole transport region comprises a hole injection layer, a hole transport layer, an electron blocking layer, or any combination thereof, and
the electron transport region comprises a hole blocking layer, an electron transport layer, an electron injection layer, or any combination thereof.

14. The organic light-emitting device of claim 12, wherein the organometallic compound is included in the emission layer.

15. The organic light-emitting device of claim 14, wherein the emission layer further comprises a host and the amount by weight of the host is greater than the amount by weight of the organometallic compound.

16. The organic light-emitting device of claim 14, wherein the emission layer emits green light having a maximum emission wavelength of about 490 nm to about 580 nm or red light having a maximum emission wavelength of about 580 nm to about 780 nm.

17. A diagnostic composition comprising at least one organometallic compound of claim 1.

* * * * *